(12) United States Patent
Halbmaier

(10) Patent No.: US 6,926,017 B2
(45) Date of Patent: Aug. 9, 2005

(54) WAFER CONTAINER WASHING APPARATUS

(75) Inventor: David L. Halbmaier, Shorewood, MN (US)

(73) Assignee: Entegris, Inc., Chaska, MN (US)

( * ) Notice: Subject to any disclaimer, the term of this patent is extended or adjusted under 35 U.S.C. 154(b) by 309 days.

(21) Appl. No.: 09/884,450

(22) Filed: Jun. 18, 2001

(65) Prior Publication Data

US 2002/0046760 A1 Apr. 25, 2002

Related U.S. Application Data

(63) Continuation-in-part of application No. 09/227,702, filed on Jan. 8, 1999, now Pat. No. 6,248,177.
(60) Provisional application No. 60/216,873, filed on Jul. 7, 2000, and provisional application No. 60/072,458, filed on Jan. 9, 1998.

(51) Int. Cl.$^7$ ................................................. B08B 3/02
(52) U.S. Cl. ........................ 134/170; 134/171; 134/902
(58) Field of Search ............................. 134/152, 166 R, 134/167 R, 168 R, 170, 171, 172, 902

(56) References Cited

U.S. PATENT DOCUMENTS

| | | | |
|---|---|---|---|
| 1,661,602 A | 3/1928 | Dary | 1343/170 |
| 1,799,525 A | 4/1931 | Morgan | |
| 2,788,008 A | 4/1957 | Wanzer | 134/101 |
| 3,073,325 A | 1/1963 | Rebizzo et al. | 134/148 |
| 3,092,120 A | 6/1963 | Hilger et al. | 134/47 |
| 3,734,109 A * | 5/1973 | Hebner | 134/64 R |
| 4,015,615 A | 4/1977 | Weber et al. | 134/196 |
| 4,133,340 A | 1/1979 | Ballard | 134/112 |
| RE31,203 E | 4/1983 | Jackson | 134/48 |
| 4,381,016 A | 4/1983 | Douglas et al. | 134/170 |
| 4,437,479 A | 3/1984 | Bardina et al. | 134/68 |
| 4,785,836 A | 11/1988 | Yamamoto | 134/56 R |
| 4,941,489 A | 7/1990 | Kamimura et al. | 134/95 |
| 4,957,129 A * | 9/1990 | Kraft et al. | 134/151 |
| 4,983,548 A | 1/1991 | Uno et al. | 437/250 |
| 5,224,503 A | 7/1993 | Thompson et al. | 134/95 |
| 5,238,503 A | 8/1993 | Phenix et al. | 134/37 |
| 5,286,302 A | 2/1994 | Wickhamm, III | 134/22.1 |
| 5,301,700 A | 4/1994 | Kamikawa et al. | 134/76 |
| 5,313,965 A * | 5/1994 | Palen | 134/61 |
| 5,363,867 A | 11/1994 | Kawano et al. | 134/95.2 |
| 5,409,545 A | 4/1995 | Levey et al. | 134/22.18 |
| 5,522,410 A | 6/1996 | Meilleur | 134/57 R |
| 5,562,113 A | 10/1996 | Thompson | 134/95.2 |
| 5,603,342 A | 2/1997 | Shambaugh | 134/154 |
| 5,616,208 A | 4/1997 | Lee | 156/345.24 |
| 5,715,851 A | 2/1998 | Jung et al. | 134/155 |
| 5,738,128 A | 4/1998 | Thompson et al. | 134/95.2 |
| 5,972,127 A | 10/1999 | Thompson et al. | 134/33 |
| 5,991,965 A | 11/1999 | Stroh et al. | 15/310 |
| 6,216,710 B1 | 4/2001 | White et al. | 134/170 |
| 6,267,123 B1 | 7/2001 | Yoshikawa et al. | 134/62 |
| 6,276,373 B1 | 8/2001 | Gotfried | 134/22.1 |
| 6,322,633 B1 | 11/2001 | Bexten et al. | 134/1 |

FOREIGN PATENT DOCUMENTS

| | | | | |
|---|---|---|---|---|
| JP | 53136358 A | * | 11/1978 | C02C/1/18 |
| JP | 06134411 A | * | 5/1994 | B08B/3/04 |

* cited by examiner

Primary Examiner—Frankie L Stinnson
Assistant Examiner—Joseph L Perrin
(74) Attorney, Agent, or Firm—Patterson, Thuente, Skaar & Christensen, PA

(57) ABSTRACT

The present invention is directed to a semi-conductor handling equipment cleaning apparatus configured for use with wafer carriers. The base of the cleaning apparatus is configured to support the wafer carrier in sealing contact about a first aperture. A first fluidic circuit is provided for introducing a first cleaning fluid to the inner surface of the carrier. A second fluidic circuit is provided for introducing a second cleaning fluid to the outer surface of the carrier. The carrier forms a barrier with the base so that the cleaning media is isolated so as to substantially prevent the second fluid used to clean the exterior from communicating with the first fluid used to clean the interior of the carrier.

15 Claims, 20 Drawing Sheets

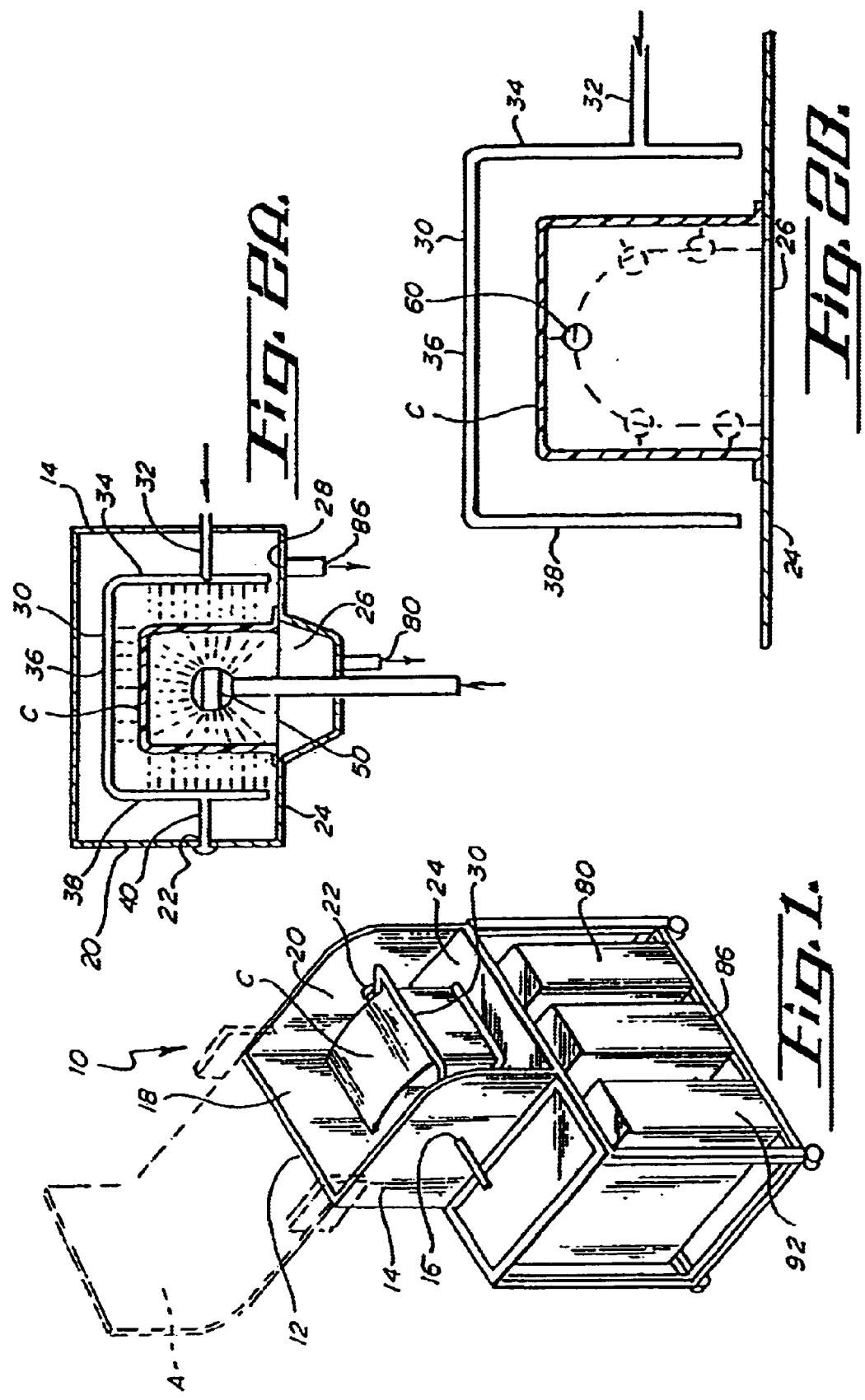

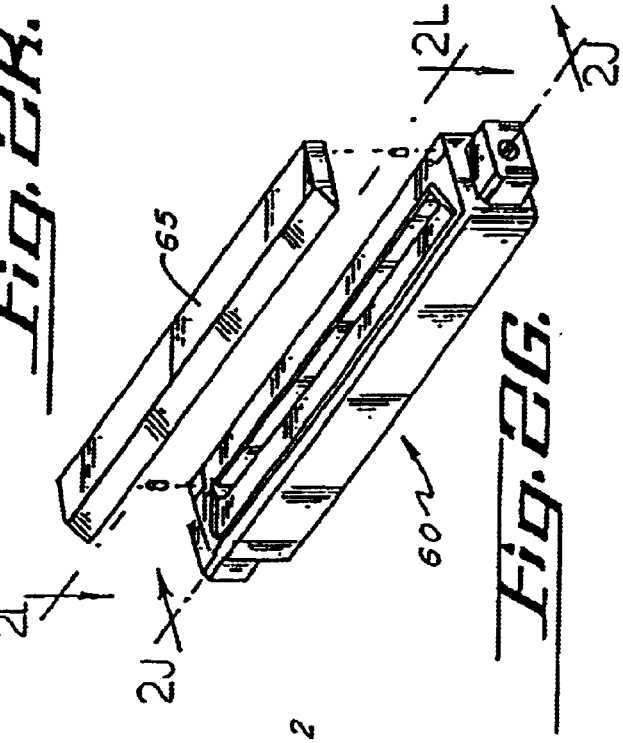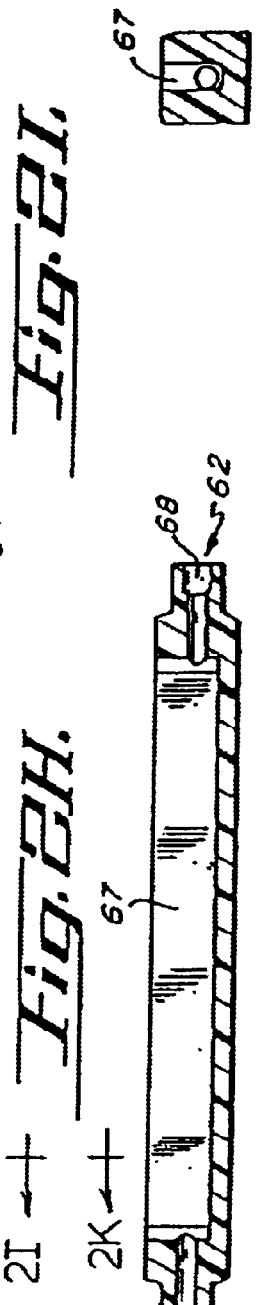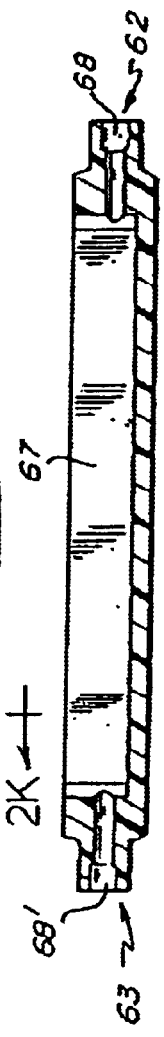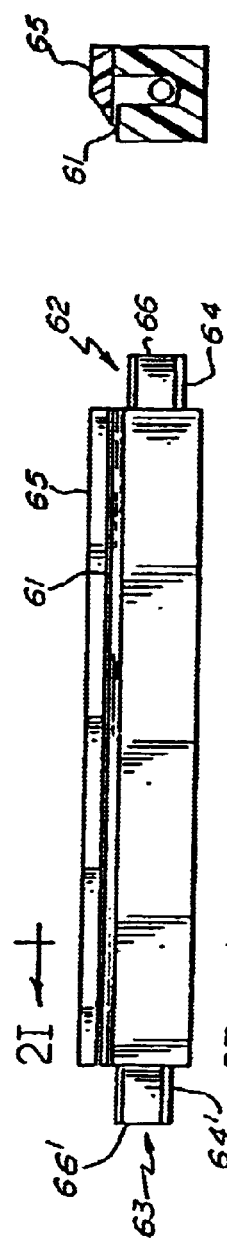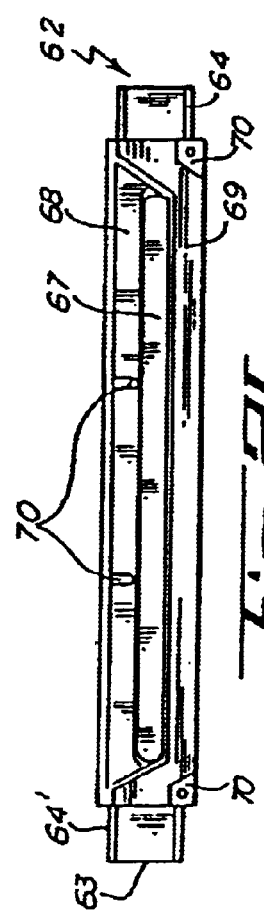

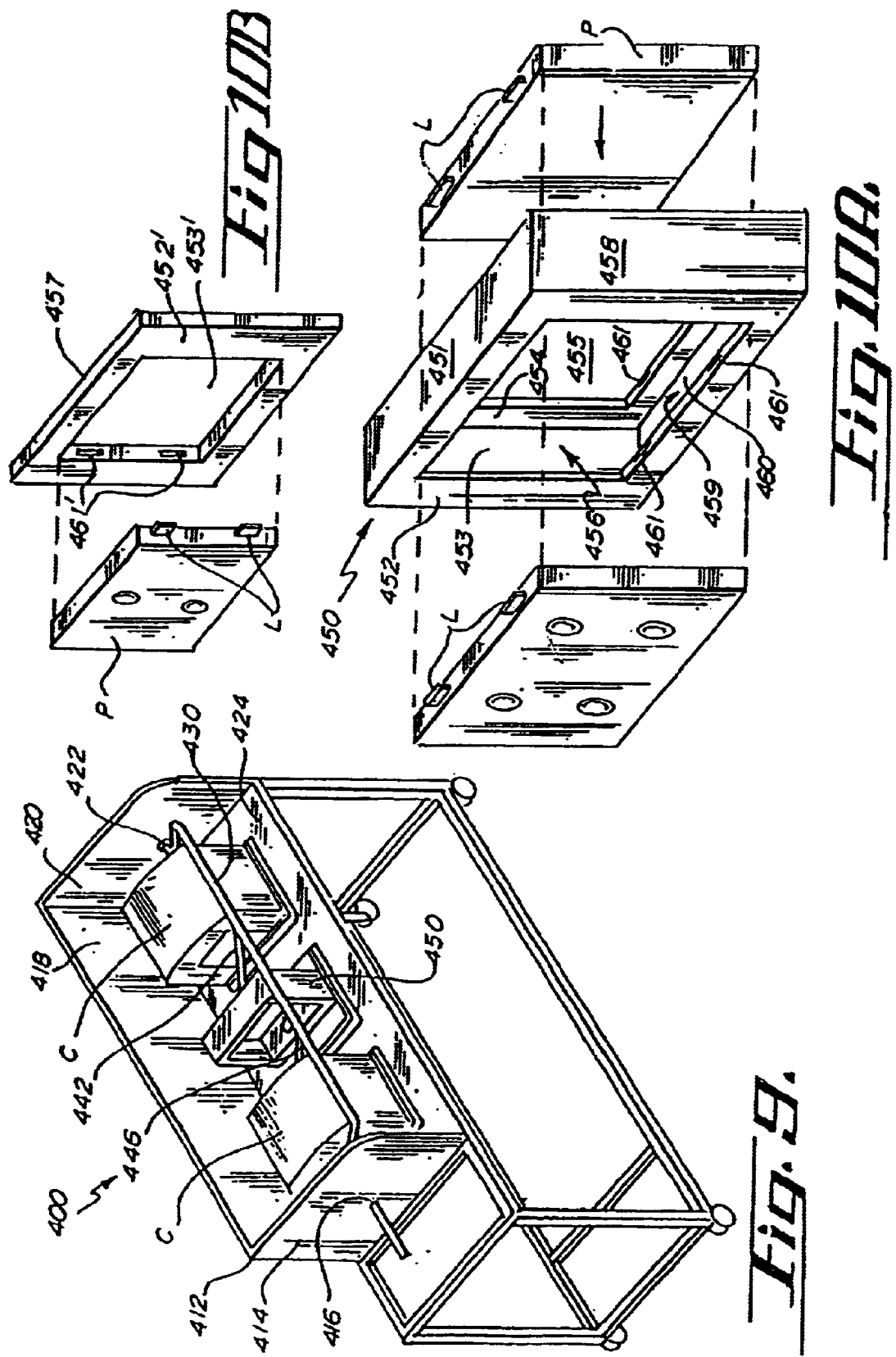

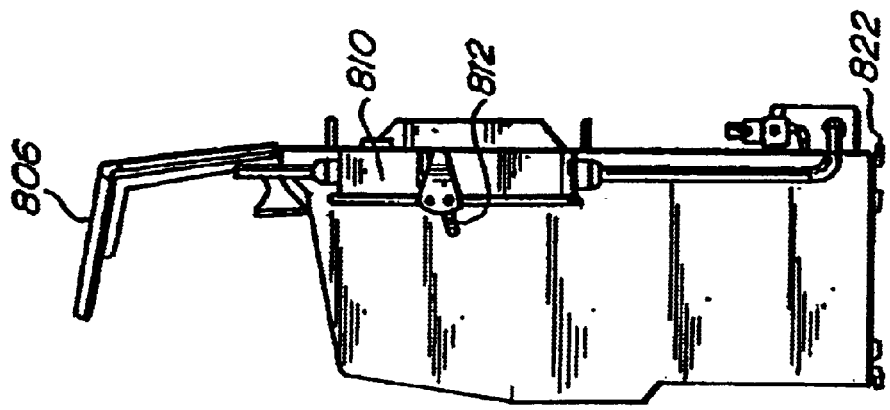
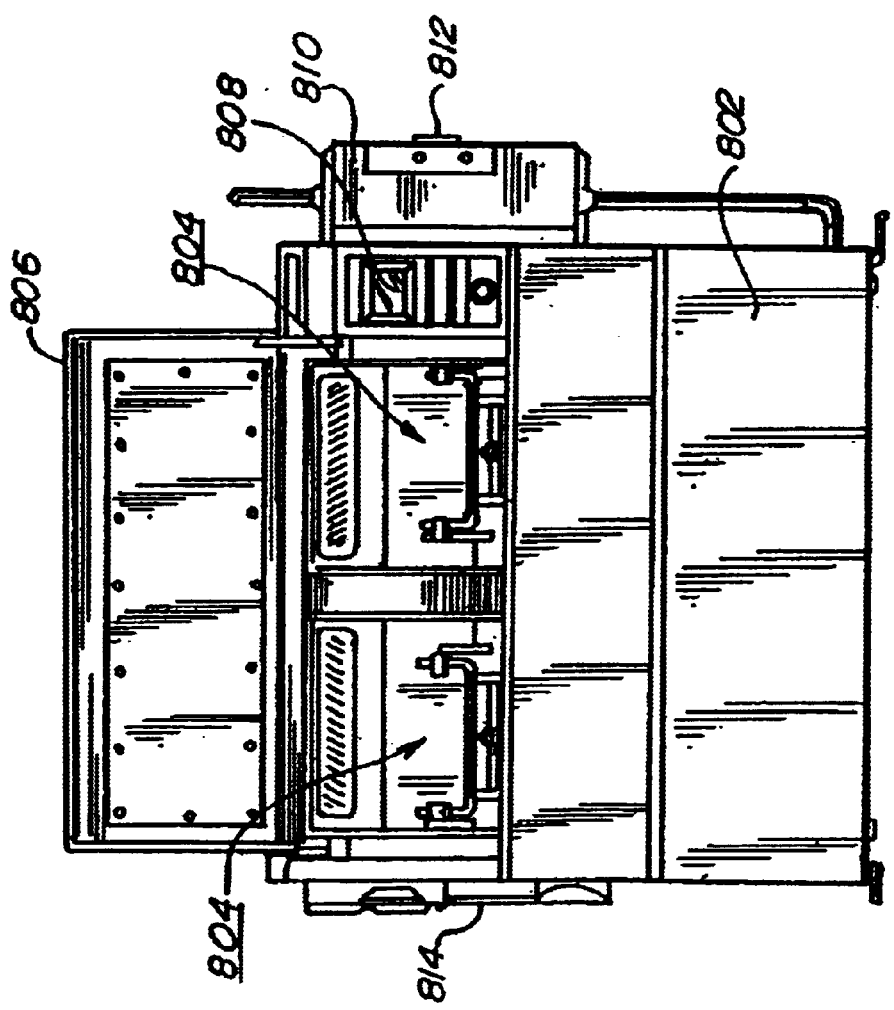

WAFER CONTAINER WASHING APPARATUS

This application is based on U.S. Provisional Patent Application No. 60/216,873, filed Jul. 7, 2000 and is also a continuation-in-part of Ser. No. 09/227,702, filed Jan. 8, 1999, now U.S. Pat. No. 6,248,177, which is based on U.S. Provisional Patent Application 60/072,458, filed Jan. 9, 1998. Both of these applications are incorporated, in their entirety, herein by reference.

BACKGROUND OF THE INVENTION

This invention relates to carriers used in clean room type environments, and more particularly to an apparatus and method for cleaning carriers used in the semiconductor fabrication industry.

The process of forming semi-conductor wafers or other delicate electronic components into useful articles requires high levels of precision and cleanliness. As these article become increasingly complex and miniaturized, contamination concerns increase. Contamination may be introduced to the substrates through the air as well as though handling devices and equipment. Contamination causes lower yield of circuit components and correspondingly increases manufacturing costs.

Airborne contamination is often significantly reduced by providing controlled fabrication environments known as clean rooms. While clean rooms effectively remove airborne contaminants found in ambient air, it is often not possible or advisable to completely process wafers in the same clean room environment. Moreover, not all contaminants are eliminated. For that and other reasons, semi-conductor wafers are transported, stored, and fabricated in bulk with the assistance specialized handling equipment such as protective carriers or pods. These carriers generally include closures that enable the carriers or pods to maintain their own micro-environment. This further reduces the potential contamination from some airborne particles.

Contamination and contaminants can be generated and introduced to wafers or substrates through the handling equipment. For example, particulates can be generated mechanically by wafers as they are inserted into and removed from wafer carriers, and as doors are attached and removed from the carriers, or they can be generated chemically in reaction to different processing fluids. Contamination can also be the result of out-gassing on the carrier, biological sources due to human activity, or even the result of improper or incomplete washing of the carrier. Contamination can also accumulate on the exterior of a carrier as the carrier is transported from station to station during processing.

Contamination of the specialized handling equipment can be reduced by periodically washing and/or cleaning of said equipment. U.S. Pat. No. 5,562,113 to Thompson et al., U.S. Pat. No. 5,363,867 to Kawano et al. and U.S. Pat. No. 4,133,340 to Ballard each disclose wafer carrier cleaning apparatuses. Thompson, Kawano and Ballard each employ a single fluid circuit. The fluid used to clean the outer surface of the carrier and the fluid used to clean the inner surface of the carrier are sourced from a common reservoir and drain off the equipment into a common drain.

In operation, the outer surface of the carrier accumulates more contaminants because it is exposed to the environment. During the washing process the spent cleaning fluids may be recycled. However, it is not desirable to introduce such recycled fluids to the interior of the carrier because suspended contaminants from the exterior may contaminate the interior.

The use of a common fluid duct also does not allow the washing apparatus to use different cleaning fluids on the inner and the outer surfaces of the carrier. Different washing fluids are often desired because the outside and inside surface of the wafer container have different cleaning properties. Cleaning apparatuses of the prior art that are capable of using separate fluids for the interior and exterior cannot recycle because the commonly collected spend fluid is a mixture and no longer appropriate for cleaning.

There are several problems associated with the prior art cleaning apparatuses. They use large amounts of cleaning fluids because they to not provide for recycling. Cleaning apparatuses that do recycle are unable to tailor the fluids to the specialized needs of both the exterior and interior surfaces. They also do not provide for the cleaning of accessory items, such as doors or closures.

Therefore, there is a need for a wafer carrier cleaner with minimal cross contamination between exterior and interior surface cleaning fluids, a wafer carrier cleaner that conserves valuable resources, a wafer carrier cleaner with a door cleaning capability, and a wafer carrier cleaner that can operate in a moderately controlled environment.

SUMMARY OF THE INVENTION

The present invention is directed to a semi-conductor handling equipment cleaning method and apparatus configured for use with wafer carriers. The cleaning apparatus comprises a base portion having a first aperture and a second aperture. The base is configured to support the wafer carrier in sealing contact about the first aperture. A first fluidic circuit is provided for introducing a first cleaning fluid to the inner surface of the carrier. A second fluidic circuit is provided for introducing a second cleaning fluid to the outer surface of the carrier. The carrier forms a barrier with the base so that the cleaning media is isolated so as to substantially prevent the second fluid used to clean the exterior from communicating with the first fluid used to clean the interior of the carrier.

The cleaning fluids are used to periodically clean, rinse, dry or otherwise prepare (e.g., decontaminate) the interior and exterior surfaces of a wafer carrier. Preferably, the fluids are applied through dedicated sprayers that are movably connected to the fluidic circuits. The fluidic circuits include the necessary and appropriate drains, valves, filters and pumps for the interiorally and exteriorally applied fluids, respectively. The valves enable the fluids in the fluidic circuits to be recycled, combined, purged or recharged, as desired.

In an alternative embodiment, multiples of wafer carriers may be cleaned concurrently. In the particular case of two wafer carriers, a fixture has been provided to enable the entire wafer carrier and attendant door to be prepared at the same time. Door removal and the placement on the cleaning apparatus may be accomplished either manually or by robotic and/or automated means.

A further alternative embodiment provides the base with a plurality of supports extending upwardly from the base to maintain the carrier in a slightly elevated position. The base is further provided with a ridge configured to restrain the flow of cleaning fluid used on the outside of the carrier from communicating with the fluid used on the inside of the carrier. Optionally, a plurality of retaining blocks may be provided to secure the carrier atop the supports.

A further alternative embodiment provides a cleaning apparatus comprising one or more wash bays, each wash bay comprising a container cleaning assembly and a door cleaning assembly, for simultaneously cleans a plurality of wafer containers and their corresponding doors. The container cleaning assembly comprises a plurality of container support structures 824 for maintaining the container vertically above the wash bay, an interior spray device and an exterior spray device. The door cleaning assembly comprises a door receiving assembly configured for receiving a container door. The door receiving assembly and door provide a fluid tight seal so that the cleaning fluid introduced to the inside of the door is maintained separately from the fluid introduced to the outside of the door and the outside of the wafer carrier.

The doors may be restraining in the door receiving assembly by the engagement of the door closures with a groove configured to receive the door closures, or the rotational mounting apparatus may be provided with a separate closure mechanism.

An object and advantage of certain embodiments of the present invention is that fluid used to prepare and/or clean the exterior surface of a wafer carrier is substantially isolated from the fluid used to prepare and/or clean the interior surface of a wafer carrier, thereby reducing cross contamination.

An object and advantage of certain embodiments of the present invention is that the exterior and interior preparation fluids are substantially contained within the separate fluidic circuit, although the fluids for cleaning the interior surfaces may be recycled and used to clean the exterior surfaces.

An object and advantage of certain embodiments of the present invention is that the useful working life of fluids is extended and wastage thereof is reduced.

An object and advantage of certain embodiments of the present invention is that the dedicated fluidic circuits simplify the delivery of different combinations and types of fluids used to accomplish different processing steps.

An object and advantage of certain embodiments of the present invention is that the apparatus can be easily and quickly reconfigured to wash a wide variety of components.

An object and advantage of certain embodiments of the present invention is that the fluid circuits may by re-charged, purged, admixed, or otherwise manipulated by the use of appropriate fluidic controls.

An object and advantage of certain embodiments of the present invention is that dedicated sprayers connected to the fluidic circuits accomplish surface preparation of exterior and interior surfaces of wafer carriers.

An object and advantage of certain embodiments of the present invention is that a wafer carrier and a door, or multiple wafer carriers and doors may be prepared at the same time.

An object and advantage of certain embodiments of the present invention is to simplify cleaning of a plurality of doors by providing a multiple door holding fixture.

Additional objects and advantages of the invention will be set forth in part in the following description and appended figures. Additional objects and advantages of the present invention will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 1 is a perspective view of the invention;

FIG. 2A is a cross-sectional plan front of the invention;

FIG. 2B is a cross sectional plan front of another embodiment of the invention;

FIG. 2G is an exploded perspective view of the fluid applicator of 2F;

FIG. 2H is a front plan view of the fluid applicator of FIG. 2G;

FIG. 2I is a cross sectional view end of the FIG. 2H taken along cut line 2I—2I;

FIG. 2J is a front cross sectional view of FIG. 2G taken along line 2J—2J;

FIG. 2K is a cross sectional end view of FIG. 2J taken along line 2K—2K;

FIG. 2L is a partial top view of the fluid applicator of FIG. 2G taken along line 2L—2L;

FIG. 9 is a perspective view of a fourth embodiment of the invention;

FIG. 10A is perspective view of the center section of the fourth embodiment;

FIG. 10B is a perspective view of a door adaptor;

FIG. 23 is a front view of the cleaning apparatus depicted in FIG. 21;

FIG. 24 is a right side view of the cleaning apparatus depicted in FIG. 21;

Figure 2C:
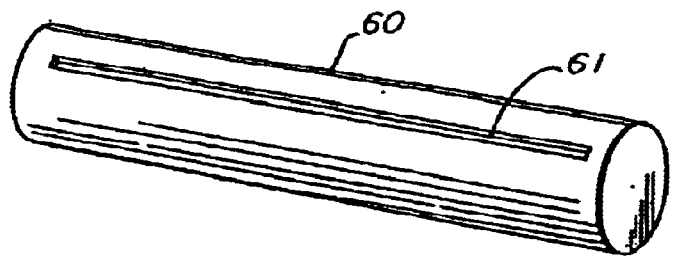
FIG. 2C is a perspective view of the interior sprayer of FIG. 2B.

It is understood that the above figures are for illustrative purposes only and are not meant to limit the scope of the claimed invention.

DETAILED DESCRIPTION

The term "wafer carrier" comprises a container that is designed or adapted to hold semiconductor wafers used in the semiconductor industry. Wafer carrier includes, but is not limited to: conventional H-bar wafer carriers; Front Opening Unified Pods (FOUP); Standard Mechanical Interface Pods (SMIF), wafer carrier door holding fixtures, and other carriers used in the micro-electronic industry for storing, transporting, fabricating, and generally holding small electronic components such as semi-conductor chips, ferrite heads, magnetic resonant read heads, thin film heads, bare dies, bump dies, substrates, optical devices, laser diodes, preforms, and miscellaneous mechanical devices.

The terms "fluid" and "fluidic" refer to states of matter which are substantially gaseous, liquid, or combinations thereof; i.e., flowable. "Fluid" or "fluidic" also include a suspension of solid particles in a liquid or gas carrier fluid.

Referring to FIG. 1, the wafer carrier cleaner of the present invention is identified generally as 10. For purposes of illustration, a wafer carrier C is depicted as it would appear during the cleaning process.

The wafer carrier cleaner 10 comprises a chamber 12 that has a first sidewall 14, a rear wall 18, a second sidewall 20 and a base 24. The first sidewall 14 has an aperture 16 that is sized to receive a portion of a first or exterior sprayer 30, and the second sidewall 20 has a support/aperture 22 that is sized to receive another portion of the exterior sprayer 30. The base includes a first aperture and a second aperture (not shown in this view) that will be described later. Note that the exterior sprayer 30 is configured such that it circumscribes the exterior of a wafer carrier. Chamber 12 may be provided with a cover or closure A (as shown in dashed lines) which, in use, encloses the chamber. The cover A may be hingedly attached to the chamber and provided with a gasket so that the chamber may be effectively sealed. Additionally, the cover may be provided with an assist and a locking device to facilitate handling thereof.

Referring to FIG. 2A, exterior sprayer 30 is generally u-shaped having a first leg 34, a span 36, and a second leg 38. The first leg 34, the span 36 and the second leg 38 are provided with at least one aperture (not shown) which directs the flow of cleaning fluid towards an exterior surface of a wafer carrier component C. A first extension 32 is attached to first leg 34 and a second extension 40 is attached to second leg 38. The extensions 32, 40 cooperate with aperture 16 and support/aperture 22 in sidewalls 14, 16, respectively, to enable sprayer 30 to rotate in an oscillatory manner about a wafer carrier C. Although the exterior or first sprayer is depicted as being generally unshaped, it is understood that sprayers of different configurations can be used without departing from the spirit and scope of the invention. For example, the external sprayer could be c-shaped and mounted for rotation about a vertical axis. Or, the exterior sprayer could be a generally closed loop through which a wafer carrier may move. Or the sprayer could be fixed. An interior or second sprayer 50 is positioned such that it projects through an aperture 26 in base 24. The interior sprayer 50 is provided with at least one aperture (not shown in this view) that directs the flow of cleaning fluid towards the interior surface of a wafer carrier. Although the sprayer depicted projects through aperture 26, it is within the scope of the invention to provide a sprayer that lies below the plane of base 24.

Cleaning fluids from different sources may be supplied to the interior and exterior sprayers as indicated by directional arrows. This fluid separation is maintained throughout the cleaning operation and, to that end, the base 24 is provided with as apertures 26, 28 wherein the used or gray fluid of interior sprayer 50 is directed through first aperture 26 and the used or gray fluid of exterior sprayer 30 is directed through second aperture 28. The separated used fluids may then be routed to first and second receptacles 80, 86 for processing and/or recycling if desired. Processing may include, but is not limited to: re-spraying; filtering; reheating; purging; deionizing; admixing; cooling; and, diluting. Controls for the wafer carrier cleaner may be contained within a third receptacle 92, as shown in FIG. 1, to facilitate automation.

Referring to FIG. 2B, the exterior sprayer 30 is essentially the same as discussed above and will not be repeated here. The interior sprayer 60 differs from interior sprayer 50 in that it utilizes a slot instead of a plurality of apertures to deliver cleaning fluid to a surface. This type of aperture is most useful for delivering gaseous fluids, and with it an area may be "wiped" dry. In operation, interior sprayer 60 starts at the top interior surface of a wafer carrier and moves along either side of the carrier. To that end, sprayer 60 may be provided with a track (shown in dashed lines) that directs the motion of sprayer 60 as desired. Alternatively, sprayer 60 may be rotatably mounted along its longitudinal axis to enable an interior of a wafer carrier to be cleaned/wiped.

Referring to FIG. 2C, the interior sprayer 60 includes a slot 61 that is used to deliver cleaning fluid to a surface. As a liquid exits slot 61 it is in the form of a sheet.

Figure 2D:
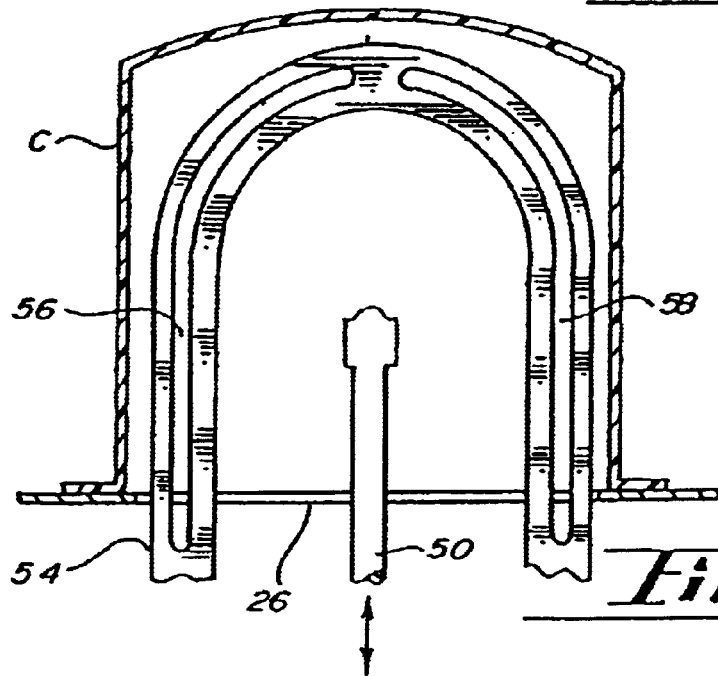
FIG. 2D is a partial side view of an interior sprayer arrangement.

Referring to FIG. 2D, the interior sprayers of 2A, 2B, and 2C are combined. The exterior sprayer is omitted for clarity. In this figure, there is an interior sprayer 50 which is movable upwardly and downwardly to enable it to spray the interior of a wafer carrier or pod. There are also two additional sprayers (not shown) whose travel is limited by grooves in parallel tracks that slidingly receive projections that extend from both ends of each sprayer (see FIGS. 2E and 2F).

Figure 2E:
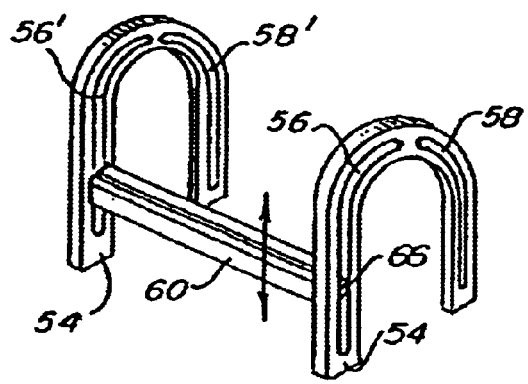
FIG. 2E is a partial exploded perspective view of FIG. 2D.

Referring to FIG. 2E, the tracks 54, 54' are generally in the shape of an inverted "U" and are identically shaped. The tracks include grooves 56, 56' 58, 58' that cooperate with both complimentary shaped protrusions that extend from the ends of the sprayers along their longitudinal axes. Note that only a single longitudinal sprayer is depicted in the figure.

Figure 2F:
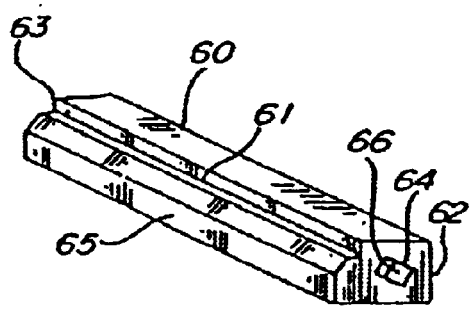
FIG. 2F is a perspective view of a fluid applicator of FIG. 2E.

Referring to FIG. 2F, the longitudinal sprayer 60 includes a slot 61 that extends along the length of the sprayer 60 and terminates at ends 62 and 63 (not shown). The sprayer 60 is provided with protrusions 64, 64' (not shown) which extend from the ends 62, 63 and which cooperate with grooves 56, 56' in tracks 54, 54', so that as the sprayer moves relative to the tracks 54, 54' the sprayer sweeps the interior of a wafer carrier or pod. The longitudinal sprayer 60 may also be provided with conventionally shaped sprayers which are located at and which extend from the protrusions. The conventional sprayers are used to spray areas that are orthogonal to the longitudinal axes of the sprayers.

Referring to FIGS. 2G, 2H, 2I, 2J, 2K, and 2L, the longitudinal sprayer comprises a generally rectangular block 60 having opposite ends 62, 63, and a longitudinal channel 67. The longitudinal channel is covered by a slat 65. When the slat 65 is placed over the channel 67 of block 60, a longitudinal slot 61 between 0.000 inches and 0.25 inches wide is formed. The preferred width of the slot 61 is around 0.004 inches. This distance is maintained by lands 70. The slat 65 is preferably adhesively attached to block 60 along a longitudinal land 69. Once the slat 65 is attached, it forms slot 61, and it is through this slot 61 that the cleaning and drying fluids are applied. At either end of block 60, are optional holes 68, 68' into which conventional sprayers may be attached.

Regarding FIGS. 2D through 2L, the preferred arrangement is to have liquid fluids applied by interior sprayer 50, and gaseous fluids applied by the longitudinal sprayers. Additionally, it is understood that the spraying movements will be from the top to the bottom. This is done to take advantage of the force of gravity and to reduce the chances that contaminated fluids fall or splash back onto clean surfaces.

It is understood that the tracks 54, 54' could be used in a similar arrangement to clean the exterior of a wafer carrier or pod.

Figure 3:
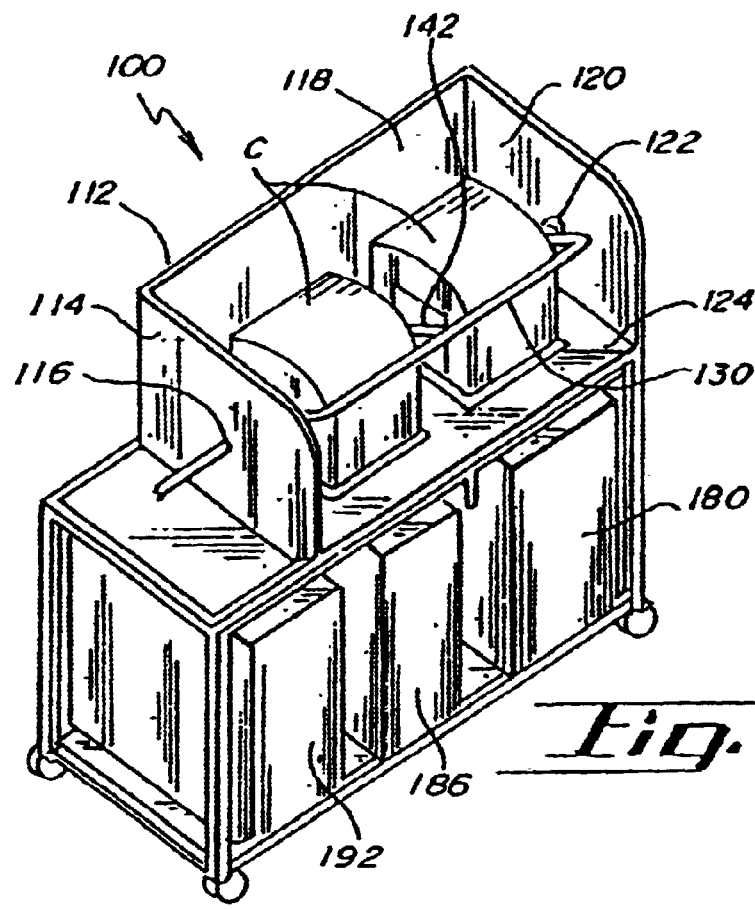
FIG. 3 is a perspective view of a second embodiment of the invention.

Referring to FIG. 3, the wafer carrier cleaner 100 comprises a chamber 112 that has a first sidewall 114, a rear wall 118, a second sidewall 120 and a base 124. The first sidewall 114 has an aperture 116 that is sized to receive a portion of an exterior sprayer 130, and the second sidewall 120 has a support/aperture 122 that is sized to receive another portion of the exterior sprayer 130. The chamber 112 is configured to allow cleaning of two wafer carriers C. The base 124 includes a first aperture, a second aperture and a third aperture (not shown) that will be described later. Note that the exterior sprayer 130 is configured such that it circumscribes the exteriors of two wafer carriers C.

Figure 4:
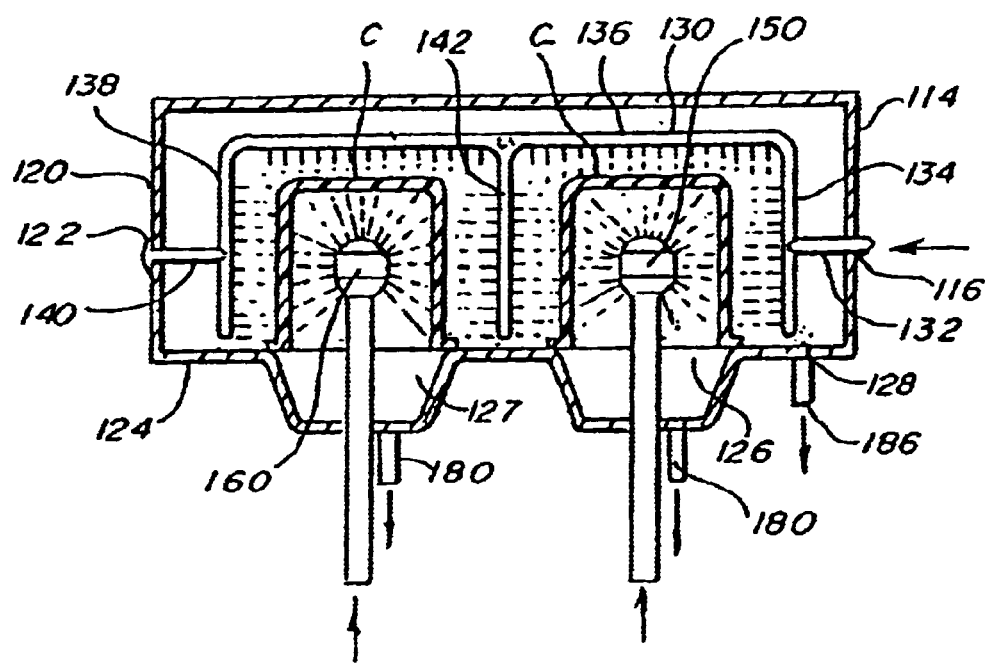
FIG. 4 is a cross-sectional front view of the second embodiment of the invention.

Referring to FIG. 4, exterior sprayer 130 is generally M-shaped having a first leg 134, a span 136, a second leg 138, and a middle leg 142. The first leg 134, the span 136, the middle leg and the second leg 138 are provided with apertures (not shown 141) that direct the flow of cleaning fluid towards exterior surfaces of wafer carriers C. A first extension 132 is attached to first leg 134 and a second extension 140 is attached to second leg 138. The extensions 132, 140 cooperate with aperture 116 and support/aperture 122 in sidewalls 114, 120, respectively, to enable sprayer to rotate in an oscillatory manner about two wafer carriers C. Interior sprayers 150 and 160 are positioned such that they project through apertures 126 and 127 in base 124. The interior sprayers 150, 160 are provided with at least one aperture (not shown) that directs the flow of cleaning fluid towards the interior surfaces of wafer carriers C. Although the sprayers depicted project through apertures 126 and 127, it is within the scope of the invention to provide a sprayer or sprayers that lie below the plane of base 124. Cleaning fluids from different sources are supplied to the interior and exterior sprayers as indicated by directional arrows. As previously described, the fluid separation is maintained throughout the cleaning operation.

Figure 5A:
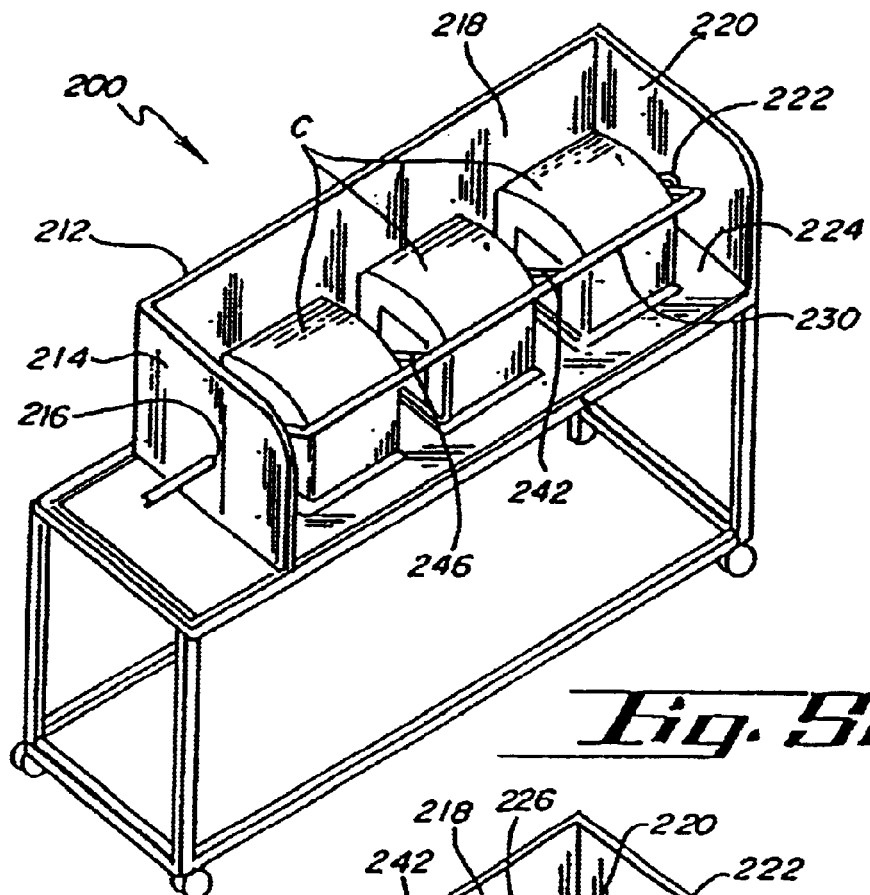
FIG. 5A is a perspective view of a third embodiment of the invention.
Figure 5B:
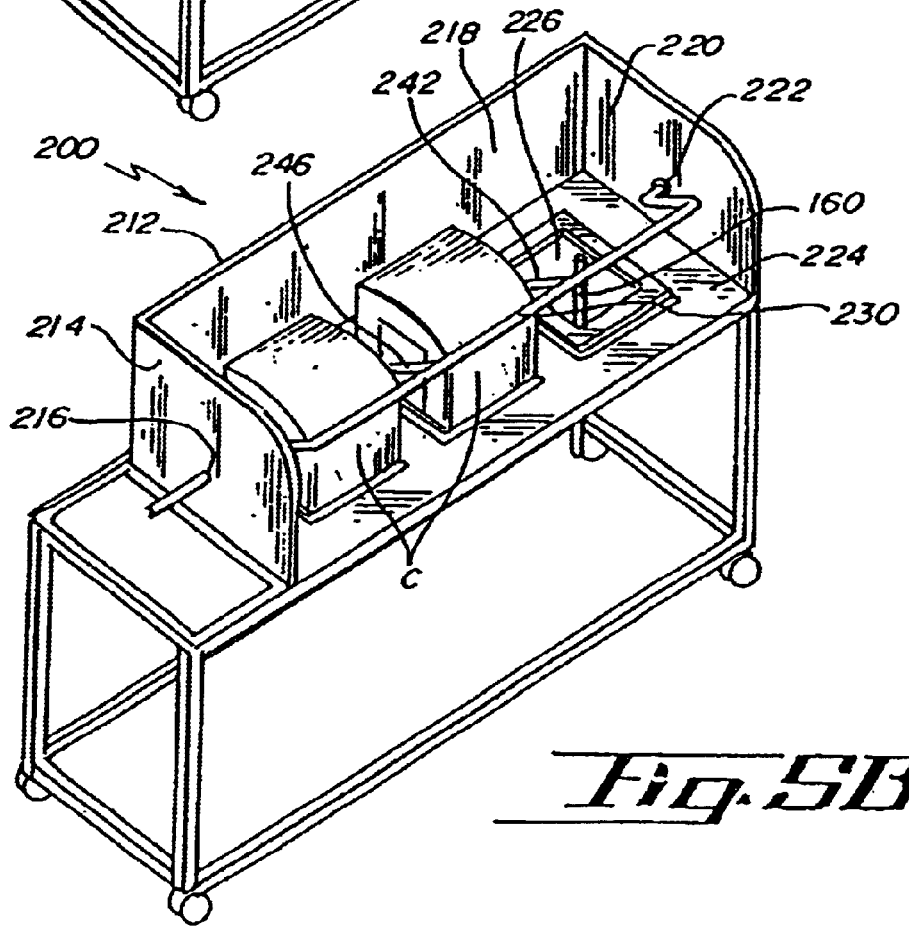
FIG. 5B is a perspective view of a third embodiment of the invention.

Referring to FIGS. 5A and 5B, the wafer carrier cleaner 200 comprises a chamber 212 that has a first sidewall 214, a rear wall 218, a second sidewall 220 and a base 224. The first sidewall 214 has an aperture 216 that is sized to receive a portion of an exterior sprayer 230, and the second sidewall 220 has a support/aperture 222 that is sized to receive another portion of the exterior sprayer 230. The base includes a first aperture 226, a second aperture, a third aperture, and a fourth aperture (not shown) that will be described later. Note that the exterior sprayer 230 is configured such that it circumscribes the exteriors of a plurality of wafer carriers C. In FIG. 5B, one of the wafer carriers has been removed to show aperture 226 and interior sprayer 150 relative thereto.

Figure 6:
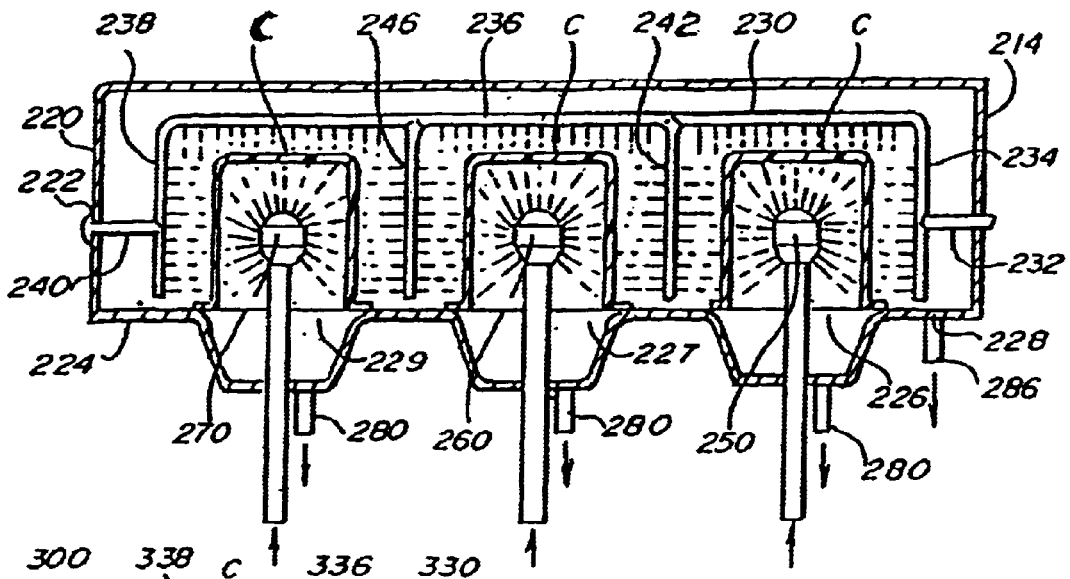
FIG. 6 is a cross-sectional front view of the third embodiment of the invention.

Referring to FIG. 6, exterior sprayer 230 is generally comb-shaped having a first leg 234, a span 236, a second leg 238, a third leg 242 and a fourth leg 246. The first leg 234, the span 236, the second leg 238, the third leg 242, and the fourth leg 246 are provided with apertures (not shown) which direct the flow of cleaning fluid towards exterior surfaces of wafer carriers C. A first extension 232 is attached to first leg 234 and a second extension 240 is attached to second leg 238. The extensions 232, 240 cooperate with aperture 216 and support/aperture 222 in sidewalls 214, 216, respectively, to enable sprayer to rotate in an oscillatory manner about wafer carriers C. An interior sprayer 250 is positioned such that it projects through an aperture 226 in base 224. The interior sprayers 250, 260, and 270 are provided with at least one aperture (not shown) that direct the flow of cleaning fluid towards the interior surfaces of a plurality of wafer carriers C. Although the sprayers depicted projects through aperture 226, 227, and 229, it is within the scope of the invention to provide sprayers that lie below the plane of base 224. Cleaning fluids from different sources are supplied to the interior and exterior sprayers as indicated by directional arrows. This fluid separation is maintained throughout the cleaning operation and, to that end, the base 224 is provided with four apertures 226, 228, 227, and 229, wherein the used or gray fluid of interior sprayers 250, 260 and 270 is directed through apertures 226, 227, 229 and the used or gray fluid of exterior sprayer 230 is directed through second aperture 228. The separated used fluids may then be routed to first and second receptacles for processing and/or recycling if desired.

Figure 7:
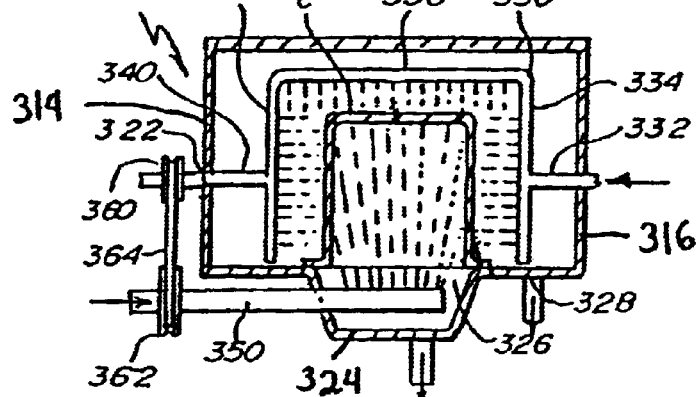
FIG. 7 is a cross-sectional front view of a synchronized spray mechanism.
Figure 8:
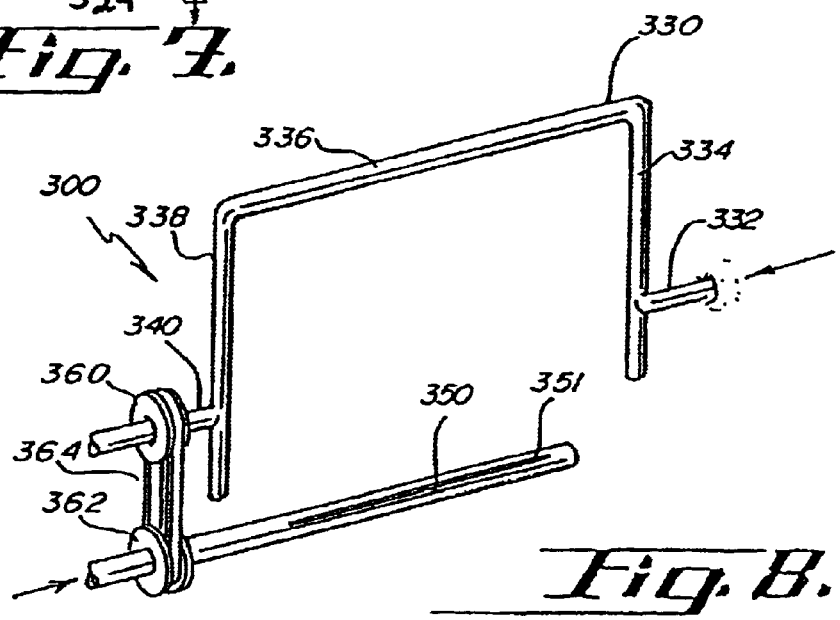
FIG. 8 is a perspective view of the synchronized spray mechanism.

Referring to FIGS. 7 and 8, the exterior 330 and interior sprayers 350 are connected to each other to permit synchronized movement. Exterior sprayer 330 is generally unshaped having a first leg 334 a span 336 and a second leg 338. The first leg 334, the span 336 and the second leg 338 are provided with at least one aperture (not shown 341) that directs the flow of cleaning fluid towards an exterior surface of a wafer carrier C. A first extension 332 is attached to first leg 334 and a second extension 340 is attached to second leg 338. The extensions 332, 340 cooperate with aperture 316 and support/aperture 322 in sidewalls 314, 316, respectively, to enable sprayer to rotate in an oscillatory manner about a wafer carrier C. An interior sprayer 350 is positioned such that it projects fluid through an aperture 326 in base 324. The interior sprayer 350 is provided with at least one aperture (not shown) that directs the flow of cleaning fluid towards the interior surface of a wafer carrier.

Although the interior and exterior sprayers are depicted for cleaning one wafer carrier, it is understood that the arrangement may be used for multiple wafer carrier cleaning chambers. The exterior and interior sprayer aperture may be conventionally configured or may be configured as one longitudinal slot, as in an air knife, for example. The sprayers may be provided with a plurality of slots or a combination of slots and apertures that produce a desired cleaning pattern. Synchronization of the interior and exterior sprayers 350, 330 is accomplished by a pair of pulleys 360, 362 attached to the exterior and interior sprayers, respectively, and a belt 364 attached therebetween. As the exterior sprayer moves, so does the interior sprayer. Different relative rotational speeds can be achieved by using differently sized pulleys. Counter rotation can be achieved by providing a twist to the pulley. Although belts and pulleys are depicted, it is within the scope of the invention to utilize other mechanisms for synchronous motion without departing from the scope of the invention.

Referring to FIGS. 9–13, chambers 400, 500 depict cleaning of a plurality of wafer carriers and a plurality of wafer carrier doors that are removably attached to a door cleaning adaptor. The wafer carriers and doors are each wafer carrier components and each has an interior and exterior surface.

Figure 11:
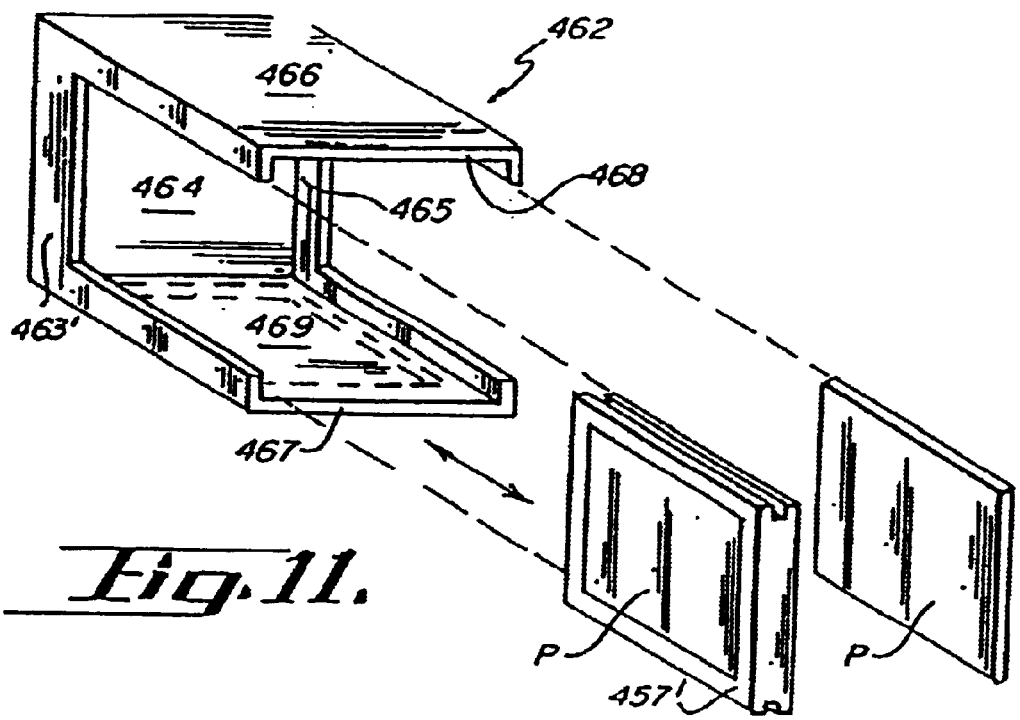
FIG. 11 is an alternate embodiment of the center section of the fourth embodiment.
Figure 12A:
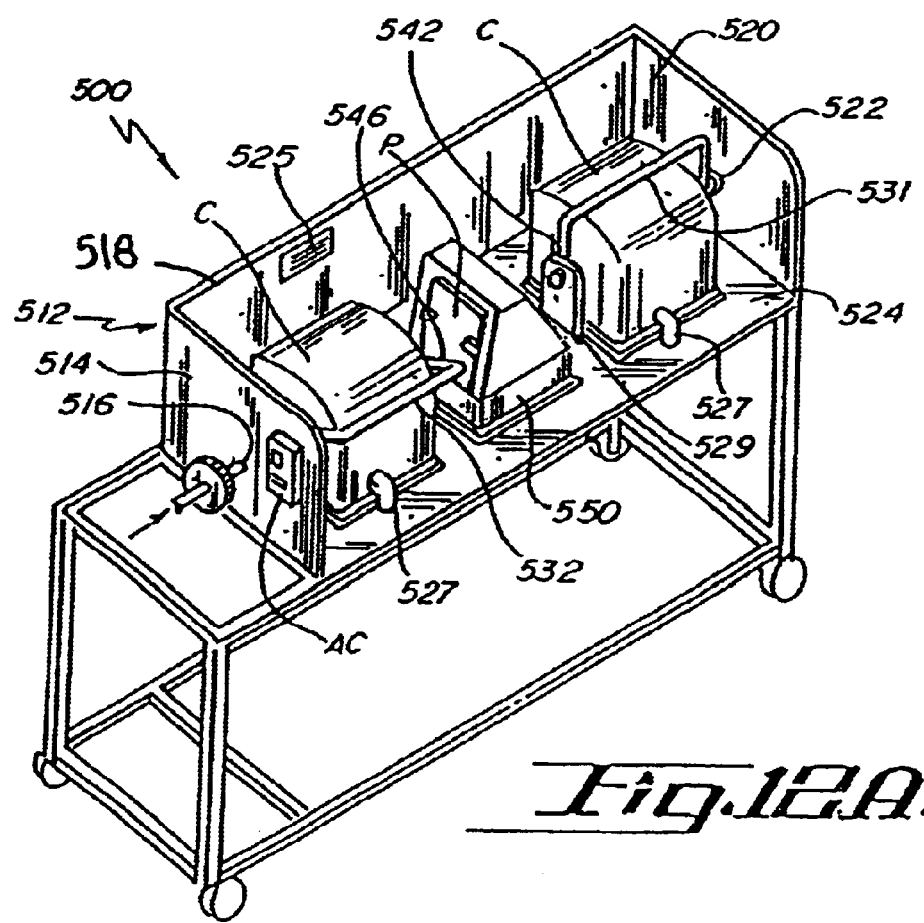
FIG. 12A is a perspective view of another embodiment of the center section of the fourth embodiment.
Figure 12B:
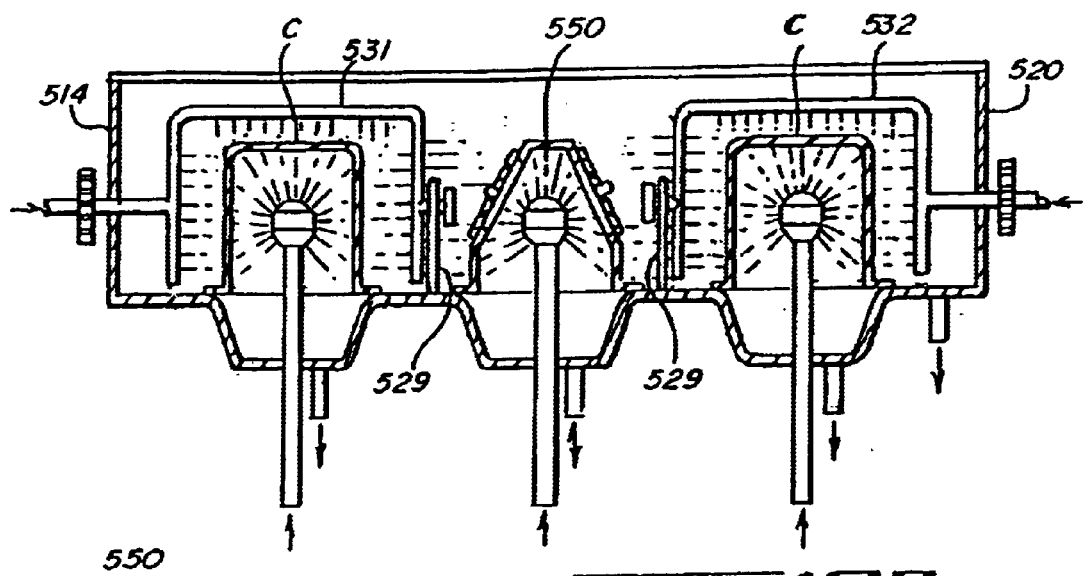
FIG. 12B is a cross-sectional front view of FIG. 12A.
Figure 13A:
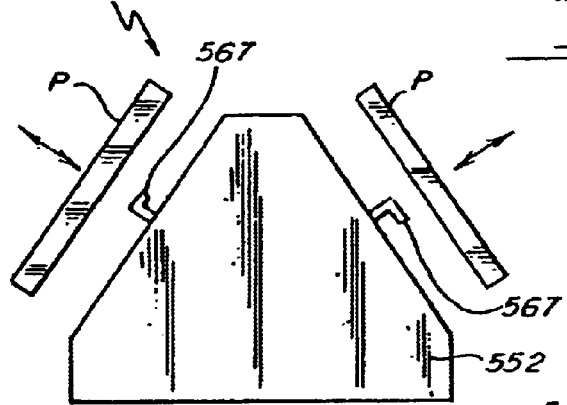
FIG. 13A is a side view of the center section as shown in FIG. 12.
Figure 13B:
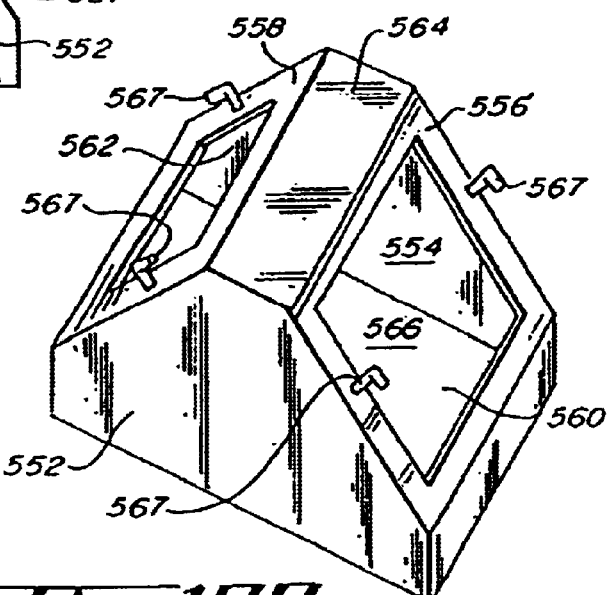
FIG. 13B is a perspective view of the center section as shown in FIG. 12.

More specifically, FIGS. 9–11 depict a chamber, which is capable of cleaning two wafer carriers, and two doors that are parallel to each other, while FIGS. 12–13 depict a chamber, which is capable of cleaning two wafer carriers, and two doors that are angled with respect to each other. Referring to FIG. 9, wafer carrier cleaner 400 comprises a chamber 412 that has a first sidewall 414, a rear wall 418, a second sidewall 420 and a base 424. The first sidewall 414 has an aperture 416 that is sized to receive a portion of an exterior sprayer 430, and the second sidewall 420 has a support/aperture 422 that is sized to receive another portion of the exterior sprayer 430. Note that the exterior sprayer 430 is configured such that it circumscribes the exteriors of a plurality of wafer carriers and a door cleaning adaptor or fixtures 450.

Referring to FIG. 10A, the door cleaning adaptor 450 includes a frame that is generally rectangular in shape and includes a first and second sides 452, 454 which include apertures 453, 455 which are sized to releasably retain wafer carrier doors P. The doors are provided with a latching tips L that can be extended and withdrawn relative to the door to enable the door to be releasably retained to the adaptor. The adaptor 450 includes a top wall 451, edge walls 456, 458 and bottom 459 with an aperture 460. Aperture 460 is provided with slots 461 which cooperate with tips L to releasably retain the doors to the adaptor 450. Aperture 460 is sized to allow interior cleaning fluid in the space defined by the cleaning adaptor and wafer carrier doors.

Referring to FIG. 10B, the door cleaning adaptor 450 includes a jig or fixture 457 onto which a door P is removably attached, and the jig or fixture 457 is removably attached to the door cleaning adaptor 450. A door P is attached to jig 457 by pins L that cooperate with slots 461'. The jig or fixture 457 may be attached to adaptor 450 in a similar manner (not shown). The jig or fixture 457 may also be used to releasably retain a wafer carrier to the base of a cleaning chamber in lieu of a direct connection, if desired (not shown). The jig or fixture 457 may be used in conjunction with the adapters depicted in FIGS. 11 and 13 if desired.

An alternative door cleaning adaptor is depicted in FIG. 11, in which the adaptor 462 includes a frame which is generally rectangular in shape and includes first and second unshaped channels 463, 465 which are adapted to receive a wafer carrier door P, or alternatively, a door P which has been attached to a jig or fixture 457'. The adaptor includes edge walls 464, 466, and 469. Edge wall 469 may include an aperture (shown in dashed lines) through which an interior sprayer or interior cleaning fluid may pass. The adaptor 462 may be provided with and a hinged edge wall that creates an enclosure, or the adaptor itself may be hingedly attached to the base at edge 467 (not shown). In either case, an interior space is created, and it is understood that this space is then cleaned in the same manner as the wafer carriers, or pods.

Referring to FIGS. 12A and 12B, wafer carrier cleaner 500 comprises a chamber 512 that has a first sidewall 514, a rear wall 518, a second sidewall 520, a base 524, fluid supply aperture 525 and an automatic controller AC. The first sidewall 514 has an aperture 516 that is sized to receive one end of a first u-shaped exterior sprayer 531, and the second sidewall 520 has an aperture 522 that is sized to receive one end of a second u-shaped exterior sprayer 532. The other ends of first and second sprayers 531, 532 are rotatably supported by stanchions 529 that project upwardly from the base of the chamber 512. The innermost leg of the first and second sprayers are capable of applying fluids to the exterior surfaces of wafer carriers C and to the exterior surfaces of centrally positioned door panels P attached to fixture 550 (i.e., in opposing directions). The independently controllable sprayers 531, 532 allow cleaning and washing to be tailored according to need. For example, the time required to prepare a relatively clean carrier and door placed in the left side of the chamber 512 may be less than the time required to prepare a relatively dirtier carrier and door in the right side of the chamber 512. Wafer carriers C may be removably secured to the base portion 524 by securement members 527, which rotate into and out of engagement with carriers C.

Figure 15:
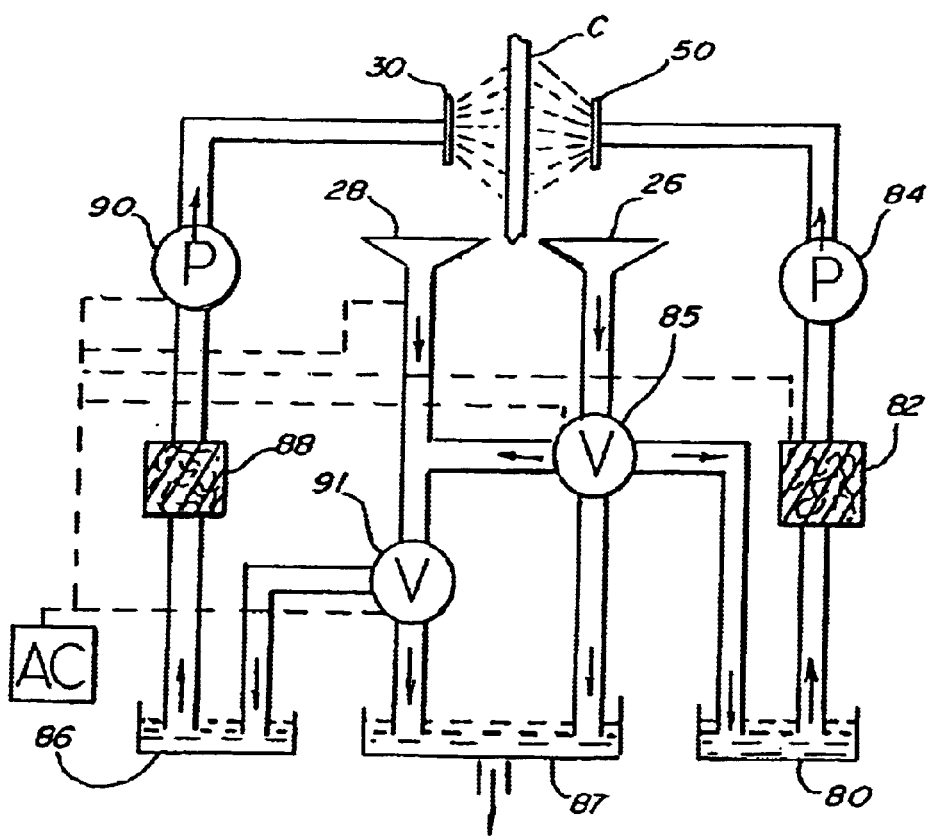
FIG. 15 is a schematic view of the invention.

Action of the wafer carrier washer 500 is preferably automated using an appropriately configured computer control AC which is in communication with the drive mechanisms for the sprayers (not shown) and with the valves, pumps, and filter elements of the fluidic circuits (see FIG. 15). Such automatic control is conventional and well known to those knowledgeable in the art and therefore will not be further detailed. For example, see U.S. Pat. No. 5,616,208, which shows a computerized control unit. Said patent is hereby incorporated herein by reference.

Referring to FIG. 13, the door cleaning adaptor 550 includes a frame is generally triangular in shape and includes first and second edges 552, 554 and first and second sides 556, 558 which include apertures 560, 562 which are sized to releasably retain wafer carrier doors P. Alternatively, doors P may be releasably retained to the adaptor 550 by securement members 567 that rotate into and out of engagement with the doors P. The adaptor 550 includes a top wall 564, and a bottom with an aperture 566. Aperture 566 is sized to allow interior cleaning fluid in the space defined by the cleaning adaptor and wafer carrier doors.

With regard to FIGS. 9–13, it is understood that the adaptor may be constructed to enable more than two doors or panels to be cleaned. For example, the bracket or frame or fixture could be cubic to enable three, four, or five doors to be cleaned, or it could be pentagonal or hexagonal to enable other combinations of doors to be cleaned. Additionally, although the bracket or frame or fixture is depicted as between two wafer carriers, it is understood that it may be positioned to either side of the chamber.

Figure 14:
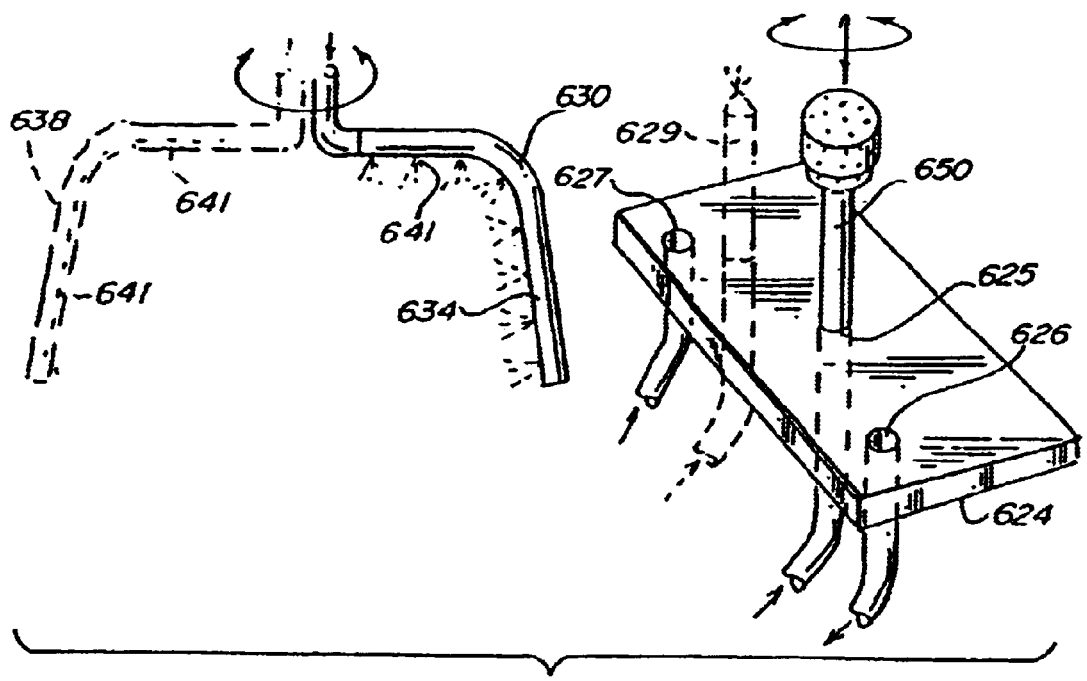
FIG. 14 is a perspective view of an alternate embodiment of the invention.

Referring to FIG. 14, the base 624 is configured to be removably retained by a wafer carrier and is similar in shape to a door (not shown). Comparing with FIG. 2, the base 626 includes an additional aperture 625 that receives interior sprayer 650. The aperture 625 is sized to effectively seal the interior sprayer 650 to the base 624. The aperture 625 may be provided with a seal such as an O-ring to enable the interior sprayer to be moved or rotated relative to the base 624. The interior cleaning fluid is directed to aperture 626 as shown in FIG. 2. The base 626 includes an additional aperture 627 through which pressurized fluid is supplied, thus creating a positive pressure differential within the space defined by the wafer carrier (not shown) and the base 624. Although a series of cleaning fluids may be applied through interior sprayer 650, it may be desirable to keep some or all of the cleaning fluids separate. To that end, an additional sprayer 629 (shown in dashed lines) may be added. Additional sprayers may be provided to the extent that none of the different cleaning fluids come into contact with each other, thus reducing cross contamination.

The exterior sprayer 630 comprises one leg 634 with at least one aperture 641 and which is arcuate in shape. The exterior sprayer is rotatably mounted such that the sprayer leg 634 circumscribes the exterior of a wafer carrier as the sprayer is rotated. Although a series of cleaning fluids may be applied through leg 634, it may be desirable to keep some or all of the cleaning fluids separate. To that end, additional legs may be provided. An additional leg 638 (shown in dashed lines) as depicted is similar to leg 634 but includes at least one air knife. With a two leg arrangement, both of the legs 634, 638 are rotatably mounted such that they circumscribe the exterior of a wafer carrier. Additional legs may be provided to the extent that none of the different cleaning fluids come into contact with each other, thus eliminating cross contamination. Drainage may also be dedicated to individual fluids by providing diverters or valves that are opened or closed as each fluid is applied to a wafer carrier.

If the interior of a wafer carrier is not in need of cleaning, a false door similar to the base 624 of FIG. 14 may be utilized to prevent contamination while the exterior of a wafer carrier is being cleaned. The difference between the two is that the false door would not have any apertures therethrough.

Referring to FIG. 15, the exterior fluid sprayer 30 is on one side of wafer carrier C and the interior fluid sprayer 50 is on the other side of wafer carrier C. As fluid is sprayed from the exterior sprayer 30 it flows into aperture 28 of the base. From there it may be directed by valve 91 to a receptacle 86 or a common receptacle 87. Receptacle 86 enables the exterior cleaning fluid to be recycled for reuse. As the exterior fluid is recycled, it may pass through filter 88 that may be provided with particulate detectors (not shown) and through pump 90.

As fluid is sprayed from the interior sprayer 50, it flows into aperture 26 of the base. From there it may be directed by valve 85 to receptacle 80, receptacle 86, or common receptacle 87. If the interior fluid is to be recycled, it is directed towards receptacle 80. From there it may pass through filter 82 that may be provided with particulate detectors (not shown) and through pump 84. As an alternative, the interior cleaning fluid may be directed towards the exterior fluid receptacle where the useful life may be extended. In the third option, the interior cleaning fluid is directed towards a common receptacle 87 for further treatment or disposal. Although the circulation system in FIG. 15 is depicted for a single fluid such as rinse water, it is understood that each fluid could be provided with a similar arrangement.

Figure 16:
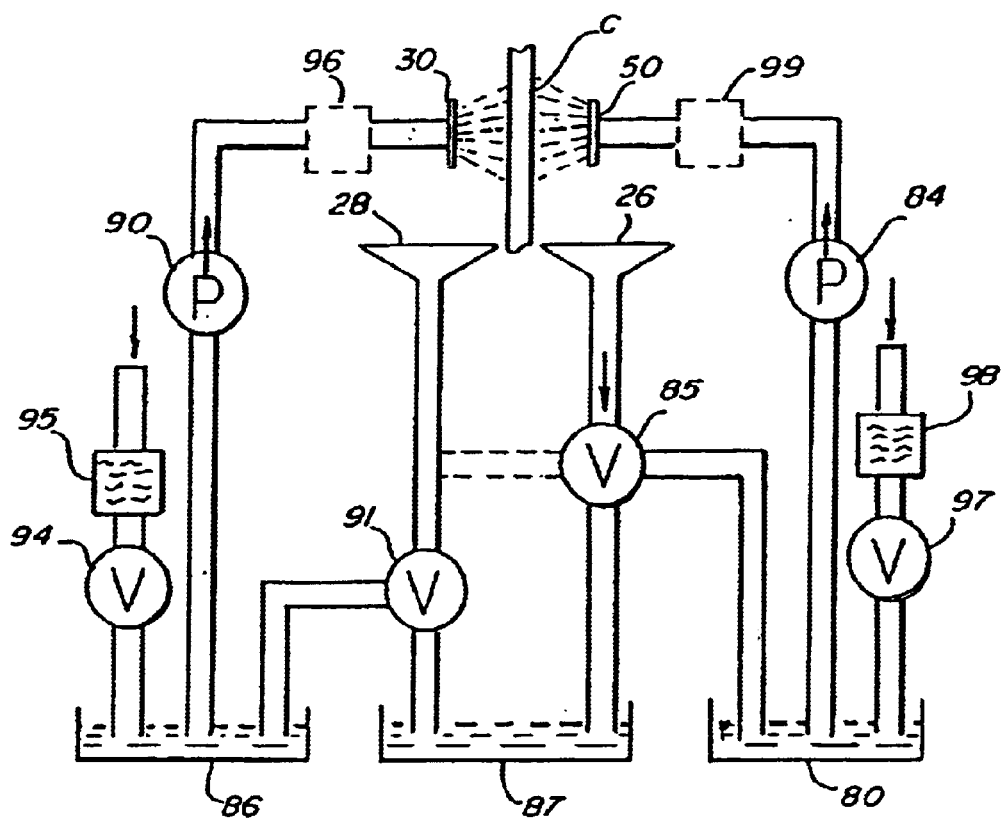
FIG. 16 is an alternate schematic view of the invention.

Referring to FIG. 16, the exterior fluid sprayer 30 is on one side of wafer carrier C and the interior fluid sprayer 50 is on the other side of wafer carrier C. As fluid is sprayed from the exterior sprayer 30 it flows into aperture 28 of the base. From there it may be directed by valve 91 to a receptacle 86 or a common receptacle 87. Receptacle 86 enables the exterior cleaning fluid to be recycled for reuse. The exterior fluid is passed through pump 90, and may pass through optional filter 96 which may be provided with particulate detectors (not shown). Additional cleaning fluid may be added to the system through a supply line equipped with a filter 95 and a valve 94. The valve may be metering valve that enable a precise amount of fluid to be added to the system.

As fluid is sprayed from the interior sprayer 50, it flows into aperture 26 of the base. From there it may be directed by valve 85 to receptacle 80, receptacle 86, or common receptacle 87. If the interior fluid is to be recycled, it is directed towards receptacle 80. From there it passes through pump 84 and may pass through filter 99 which may be provided with particulate detectors (not shown). As an alternative, the interior cleaning fluid may be directed towards the exterior fluid receptacle where the useful life may be extended. In the third option, the interior cleaning fluid is directed towards a common receptacle 87 for further treatment or disposal. Although the circulation system in FIG. 16 is depicted for a single fluid such as rinse water, it is understood that each fluid could be provided with a similar arrangement.

Additional cleaning fluid may be added to the system through a supply line equipped with a filter 98 and a valve 97. The valve may be metering valve that enable a precise amount of fluid to be added to the system. Since the operation of the exterior cleaning fluid side is essentially the same as the operation of the interior cleaning fluid side, only the exterior cleaning side will be described. Valve 94 opens and admits a predetermined amount of cleaning fluid, for example filtered, deionized, heated water, into the circuit. Pump 90 is then actuated which in turn activates exterior sprayer 30. Cleaning fluid is collected in aperture 28 and may be directed back to receptacle 86 or common receptacle 87. When the cleaning fluid is directed to the common receptacle, a new charge of cleaning fluid is admitted into the system.

In general, chambers 12, 112, 200, 400, and 500 may be provided with a cover (for example, shown in dashed lines in FIG. 1 as A) that covers the top and front of the chamber during the cleaning process and effectively seal the chambers. The inclusion of covers enables the chambers to operate in conditions that are not ultra-clean. To further reduce cross contamination, a positive pressure differential may be created between the interior and exterior of a wafer carrier to be cleaned. And, to further reduce cross contamination, a positive pressure differential may also be created between the chamber and the environment. Thus, extraneous contaminants are preferably directed from a relatively cleaner environment to a relatively dirtier environment. The pressure differentials may be created by use of positive pressure, negative pressure or a combination of positive and negative pressures.

Additionally, the base portion of chambers 12, 112, 200, 400, and 500 may be provided with an appropriately configured sealing element which may be placed at the interface of the base portion and the wafer carrier to further effectively prevent cross contamination between the fluidic circuits.

Figures 17A, 17B, 17C:
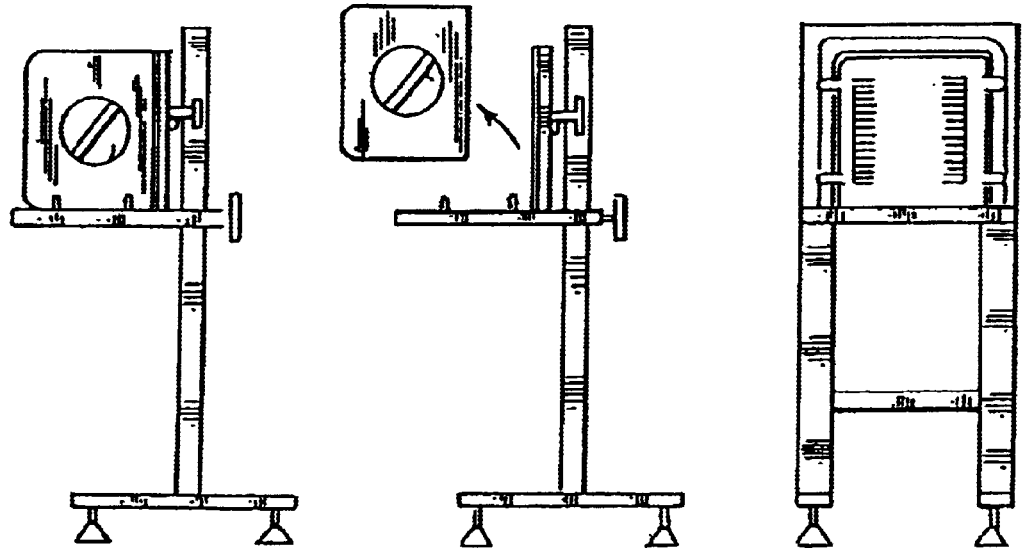
FIGS. 17A, 17B and 17C are side and front elevations showing a door unlocking station used in conjunction with the wafer carrier cleaner.

The method of use will now be briefly discussed. A wafer carrier that is to be cleaned is brought to the chamber area. If the wafer carrier has a panel or door, it is removed and preferably attached to a door cleaning adaptor (see FIGS. 17A, 17B and 17C). The wafer carrier is then positioned within a chamber such that it covers the second or interior sprayer. The cover to the chamber is than closed to effectively seal the chamber, at which time the cleaning cycle is initiated. Separate cleaning fluids, which may be liquid and or gaseous in nature, and which may be heated or cooled, are then applied to the interior and exterior surfaces. After the cleaning cycle is completed, the wafer carrier and panel are preferably dried with gaseous fluids such as NO2 and which may be heated to reduce drying time. If desired, interior gaseous fluids may be directed to the exterior surface to assist in drying. After the drying cycle is complete, the wafer carrier and panel are removed and reassembled. It should be understood that movement, transfer, and the opening and closing of the carrier may be accomplished manually or by automated means.

Figure 19:
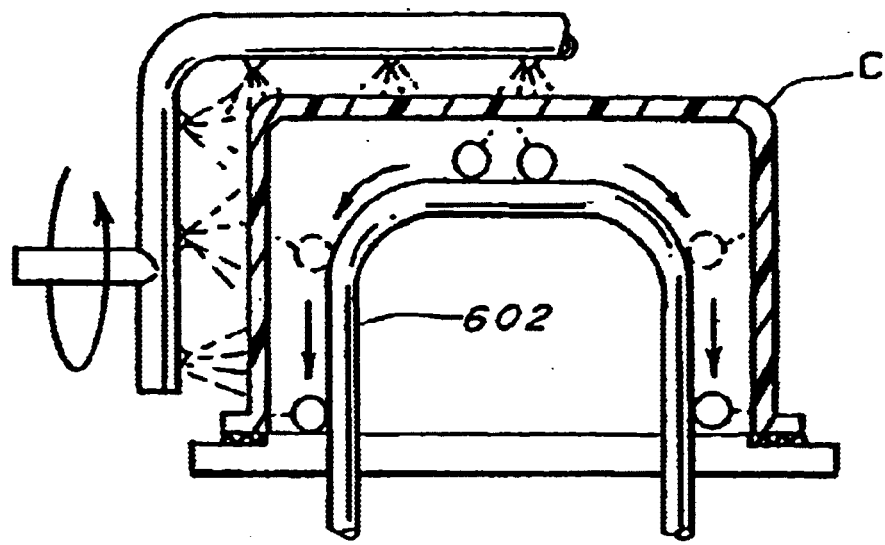
FIG. 19 is across sectional front view of a single wafer carrier cleaning station.

As an alternative to drying the interior surface of a wafer carrier or pod by a moving sprayer, the interior surface may be dried by providing a block or mandrel 602 (FIG. 19), which is sized to occupy a substantial amount of space defined by the wafer carrier or pod C. A drying fluid would then be introduced along a portion of the open space defined by the wafer carrier or pod and the block. Because the block is sized to substantially occupy the space defined by a wafer carrier or pod, the drying fluid would be constrained to move within the open space defined by the block and the wafer carrier. Thus, the drying fluid can obtain relatively high velocities, whereby drying time is reduced. Both the drying fluid and the block or mandrel may be heated to further reduce the amount of drying time.

The mandrel or block may also be combined with moveable sprayers wherein the sprayers follow the contour of the mandrel instead of the tracks as discussed above.

Figure 20:
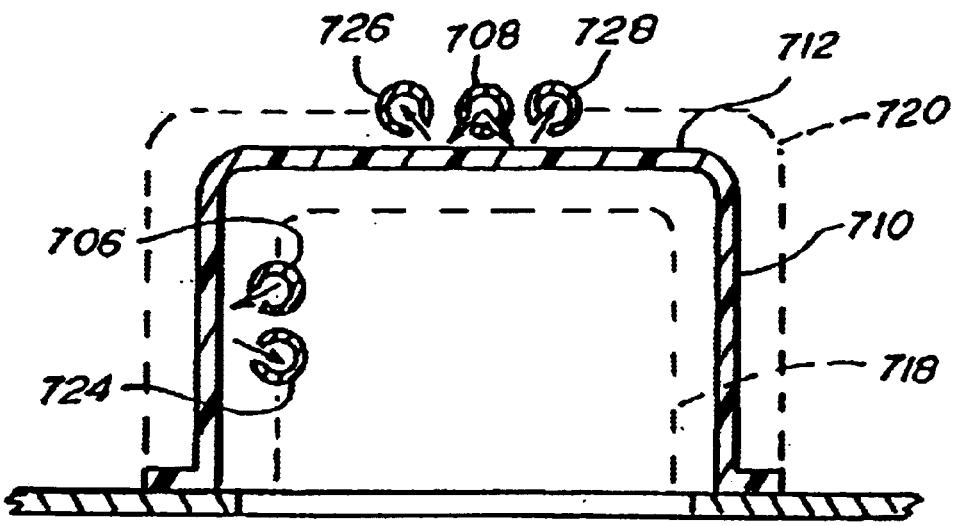
FIG. 20 is a sectional side view showing an alternative drying arrangement.

Referring to FIG. 20, an alternative drying arrangement is shown. Drying gas discharge members 706, 708 travel along the interior 710 or exterior surface 712 along the pathways 718, 720 designated by dashed lines. In conjunction therewith one or more moisture collection members 724, 726, 728 having a negative pressure travel with the drying gas discharge members to efficiently collect the discharged drying gas and moisture, particulates and/or other debris which may be on the surfaces or features of the pod C. The suction of the drying gas and moisture accelerates the drying process as droplets are not merely blown off the surfaces for possible redeposition but are generally collected. The dry gas discharge members and collection members may be suitably configured and operated as shown in the single sprayer in FIGS. 1 and 2A or the other multiple sprayer configurations as shown. Additionally, these members may be suitably track mounted as illustrated in FIGS. 2E and 2D.

Figure 21:
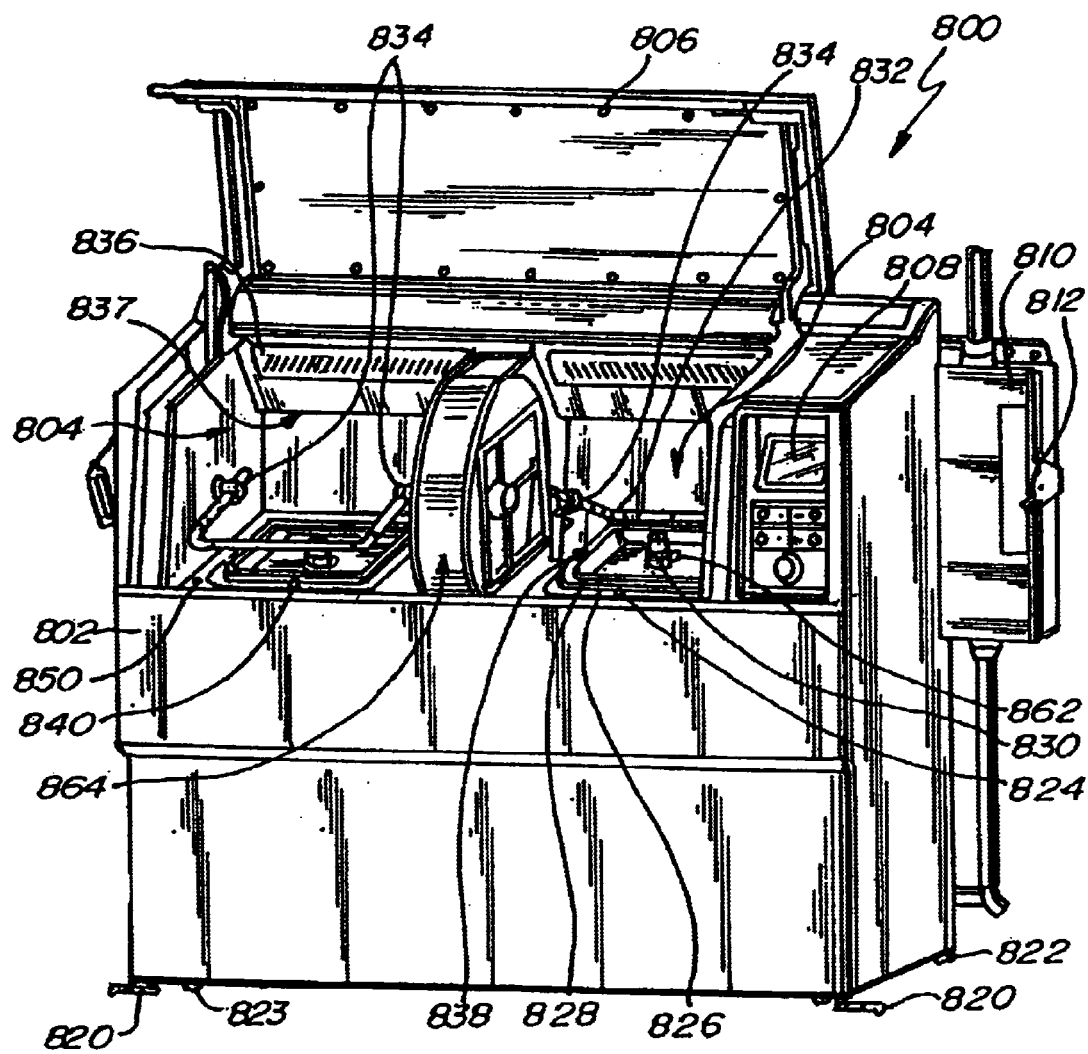
FIG. 21 is a front perspective view of an embodiment of the present invention.

A preferred embodiment of the present invention is depicted in FIGS. 21–34. Referring to FIG. 21, wafer carrier component cleaning apparatus 800 comprises a body 802 having two wash bays 804 and lid 806. One or more bays are contemplated by the present invention. Control panel 808 may be provided on body 802 to allow a user to operate the apparatus 800. A breaker box 810, with power cutoff switch 812, may be provided as part of a general power supply hookup system known to those skilled in the art.

Figure 22:
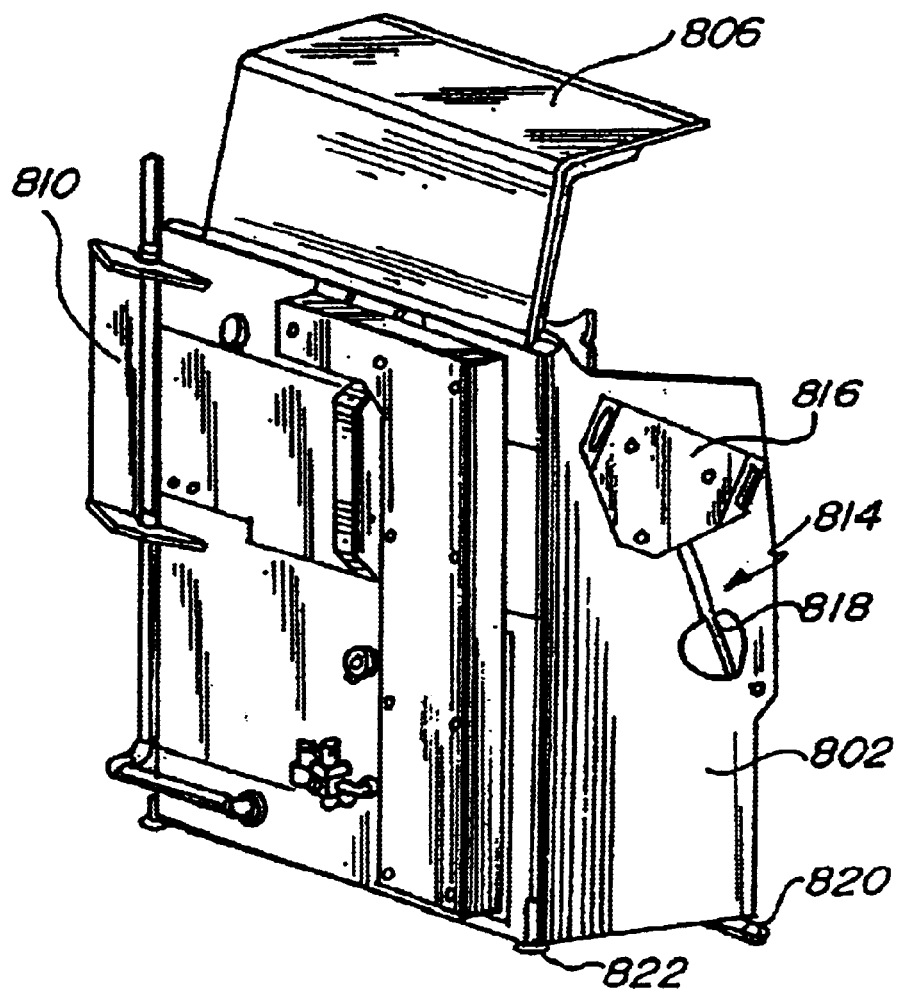
FIG. 22 is a rear perspective view of the cleaning apparatus depicted in FIG. 21.
Figure 25:
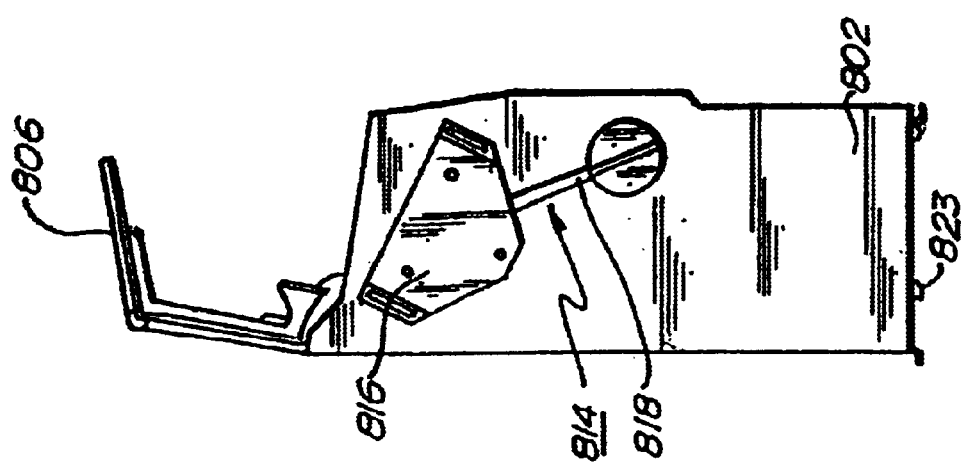
FIG. 25 is a left side view of the cleaning apparatus depicted in FIG. 21.

Referring to FIGS. 22 and 25, body 802 may be provided with an adjustable platform 814. Platform 814 comprises a base 816 pivotally mounted to an adjustable arm 818. Platform 814 is maintained in a retracted form, shown in FIG. 25 until the user desires a working surface for aiding the manipulation of a wafer container. When the working surface is desired, the platform 814 is rotated until arm 818 is horizontal and then base 816 can be pivoted to any direction desired by the user. The base 816 may be configured to mate with a respective portion of a wafer container.

Figure 27:
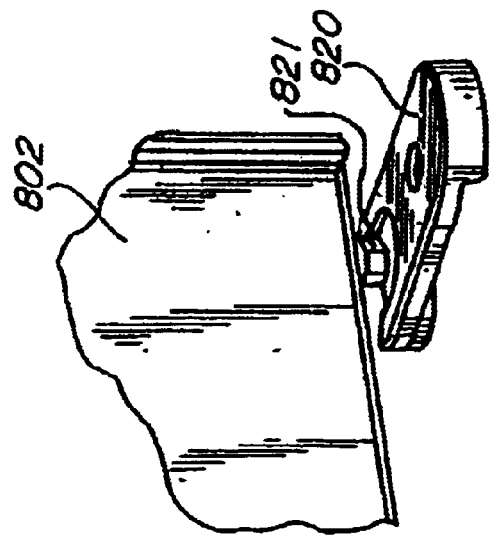
FIG. 27 is a front view of the front mounting foot.
Figure 26:
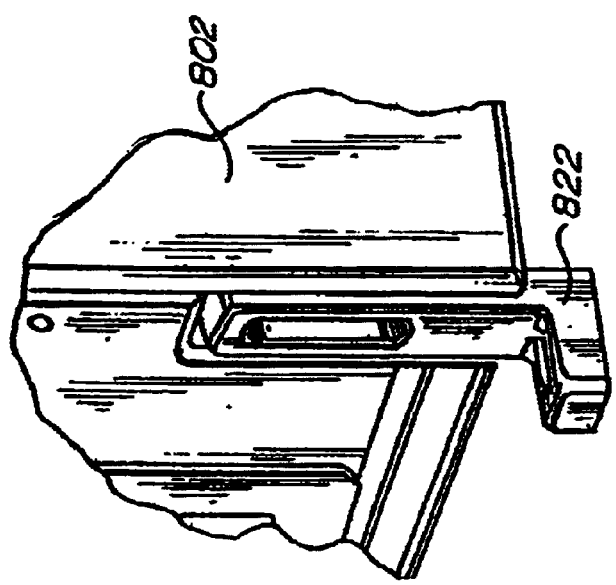
FIG. 26 is a detail view of the rear mounting foot.

Referring to FIGS. 26 and 27, the cleaning apparatus may be provided with front mounting feet 820 and rear mounting feet 822. Front feet 820 are adjustable for leveling by rotating leveling nut 821. The front feet 820 are also configured for use as seismic tie downs. Rear feet 822 are vertically adjustable and are configured for use as seismic tie downs. Alternatively or additionally, the cleaning apparatus may be provided with casters 823 for mobility as shown in FIGS. 21 and 25.

Figure 28:
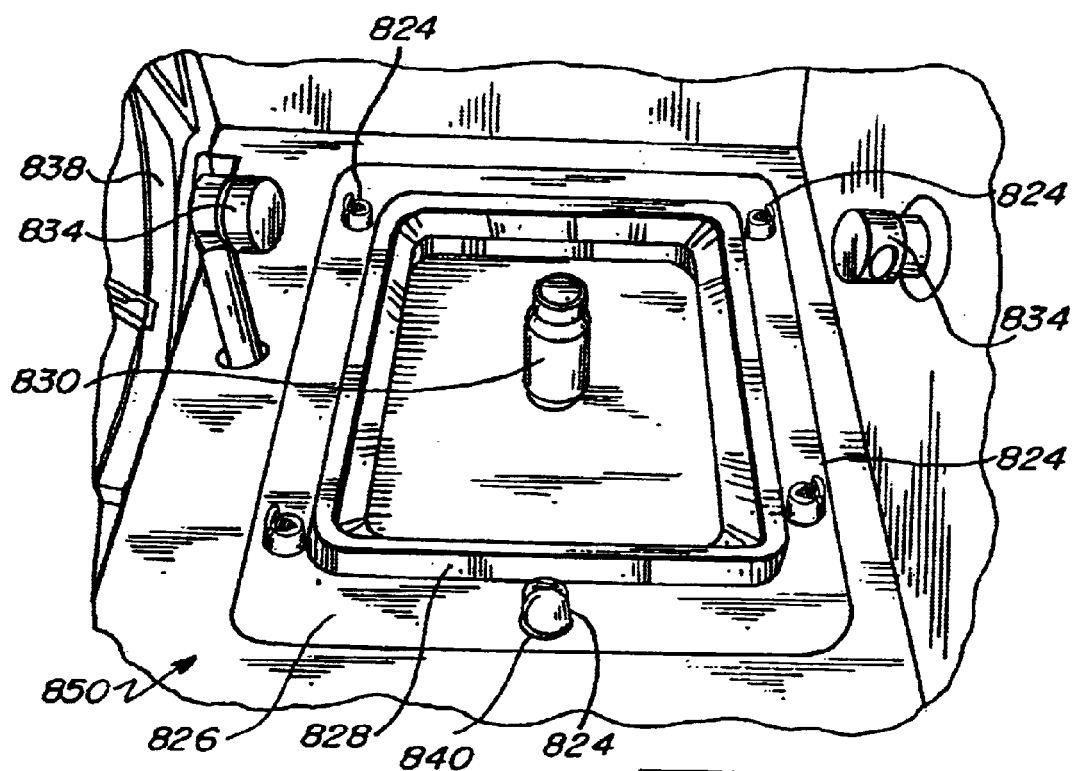
FIG. 28 is a detail view showing the wafer container receiving portion of the base of the cleaning apparatus shown in FIG. 21.

Referring to FIGS. 21 and 28, each wash bay 804 comprises a carrier cleaning assembly 838 and a door cleaning assembly 864. The carrier cleaning assembly 838 comprises a plurality of container support structures 824, a removable collar 826, an interior spray nozzle 830, an exterior spray bar 832 rotatably mounted to left and right rotational mounts 834, exhaust duct 836, and door cleaning assembly 864. The exterior spray bar 832 is provided with a plurality of nozzles about its inside arc for spraying cleaning fluids on the exterior surface of the carrier. A portion of the outside arc of the exterior spray bar 832 is also provided with a plurality of nozzles configured to introduce cleaning fluid to the outside of the door.

A vertically extending ridge 828 is formed integrally with collar 826. Ridge 828 functions to prevent fluid introduced to the exterior of the carrier from entering the fluidic circuit containing fluids introduced to the inside of the carrier. Collar 826 is easily removable from the wash bay to allow a collar configured for a different carrier design to be inserted. Such removability allows cleaning apparatus to be easily adaptable to a variety of container shapes, styles and sizes.

Figure 29:
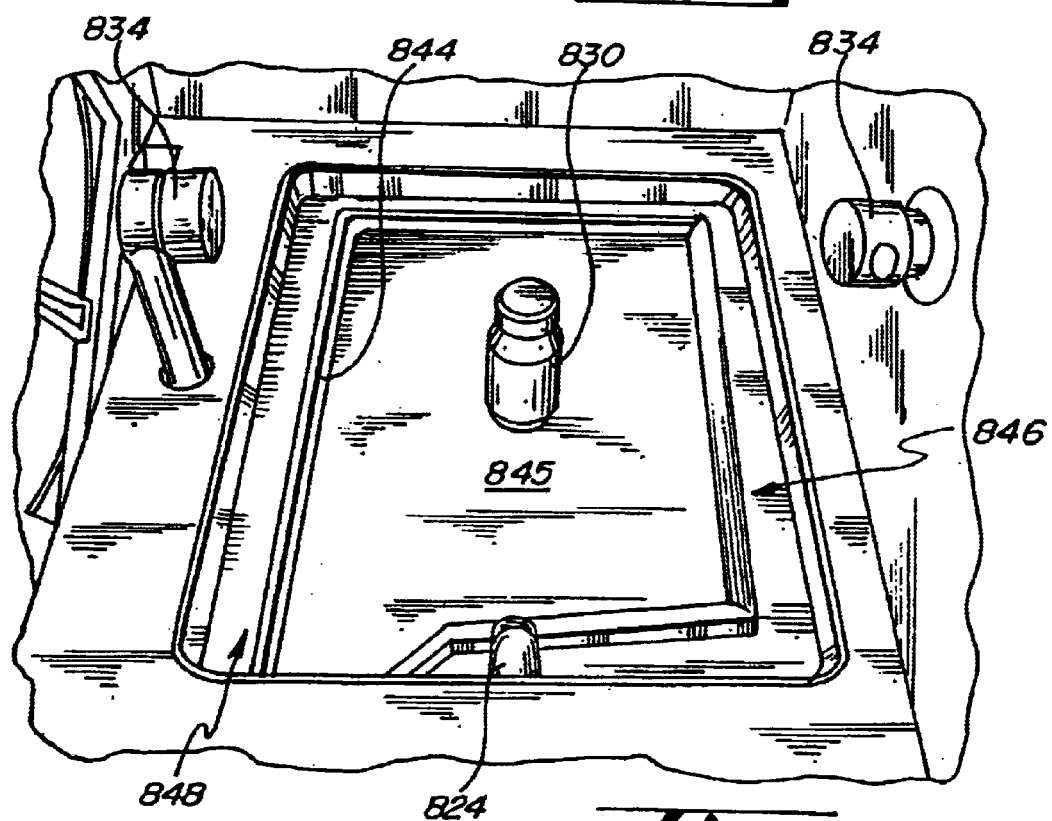
FIG. 29 is a detail view showing the wafer container receiving portion of the base of the cleaning apparatus shown in FIG. 21 with the fluid separator collar removed.

Referring to FIG. 29, the wash bay 804 is shown with the collar 828 removed. At least one support post or structure 824 is not adjoined to the collar, but rather is rigidly mounted to the wash bay 804. The support post 824 mounted to the wash bay 804 extends to the same length as the remaininder of support structures 824 by fitting through aperture 840 in the collar 826, as shown in FIG. 28. The collar 826 is preferably disposed in a recess 848 to permit flush appearance of the wash bay floor 850. The interior fluid receptacle 842 of the wash bay 804 is provided with a bifurcating ridge 844 separating an inside region 845 and outside region 846. The inside region 845 contains the spent fluids from washing the interior of the carrier and the outside region 846 contains any leakage of spent fluids from washing the exterior of the carrier.

Figure 30:
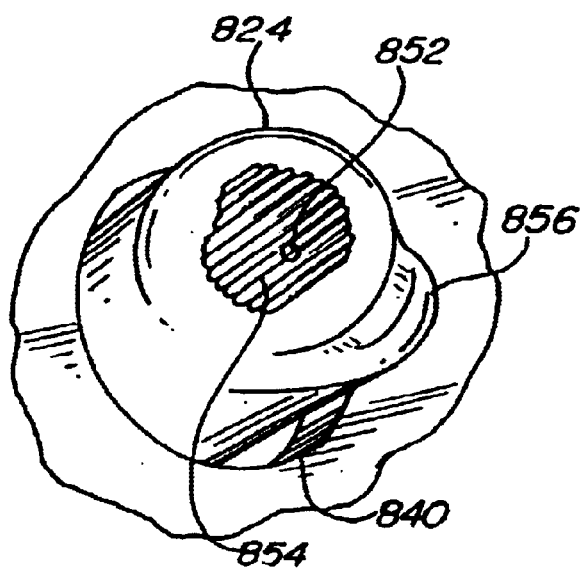
FIG. 30 is a detail view of a container support.

Referring to FIG. 30, the container support post 824 extending through the collar is shown. Support structure 824 comprises a flat support region 854 for restraining the container vertically, an aperture 852 and a lip 856 for restraining the container horizontally. The aperture functions to allow the washing apparatus 800 to sense the presence of a container in the wash bay 804. A small flow of air is sent through aperture 852, which is monitored with an airflow sensor. When the carrier is placed upon the support 824, the aperture 852 is sealed and the airflow is blocked. The sensor detects the change in airflow and relay this information to a user or control system. Those skilled in the art will recognize that other types of sensors may be used.

Figure 31:
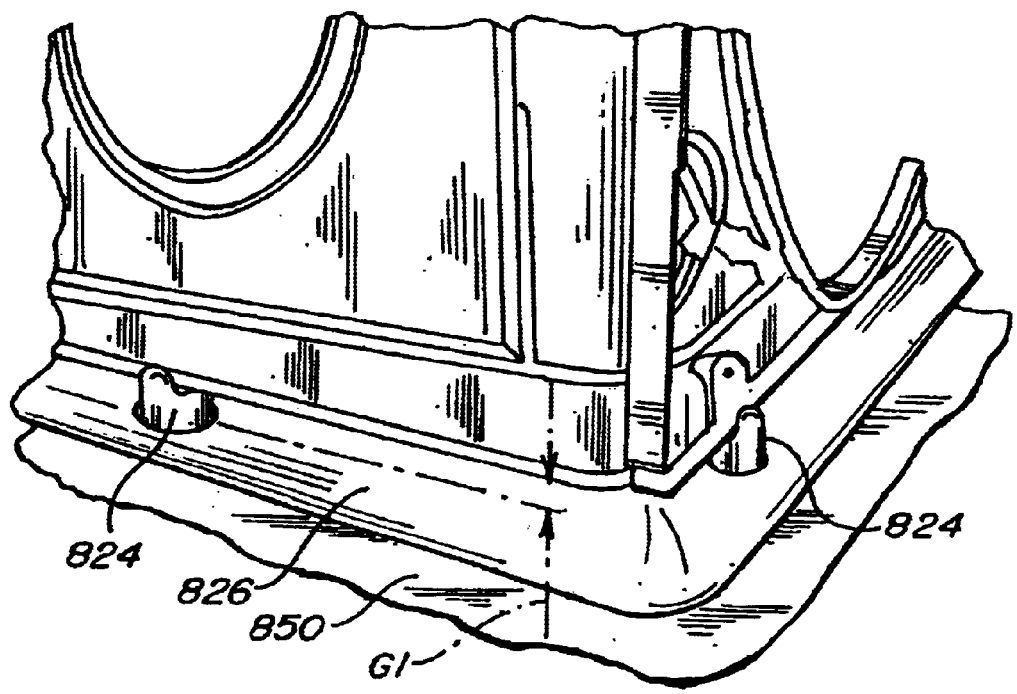
FIG. 31 is a detail view showing the wafer container receiving portion of the base of the cleaning apparatus shown in FIG. 21 with a wafer container in place.

Referring to FIG. 31, a wafer container is shown in the wash bay 804. A gap G1 is indicated in the figure between the edge of the container and the collar 826. This illustrates the fact that the carrier is maintained above the wash bay 804 and the only points of contact between the container and the washing bay 804 are at the support structures 824. By minimizing the contact area with the container, drying time is significantly reduced. The ridge 828 extends upward from the lowermost point of the container (not shown). There is also a minimal gap between the inside of the container and the ridge 828 so that the ridge does not contact the container or retain fluid therebetween.

A small amount of cleaning fluid used on the inside of the container may occasionally escape to the outer fluid circuit because there is not a completely fluid tight seal. Such minimal leakage is acceptable because the amount is insignificant and the fluid is relatively clean compared to the spent outer fluid. Those skilled in the art will recognize that the main concern is to ensure that spent fluid from the outside of the container entering the fluid passage containing the fluid used on the inside of the container is minimized. However, the passage of a minimal amount of spent outside cleaning fluid is still permissible as it will not affect the cleaning effectiveness.

Optionally, sensors may be placed in one or both of the fluid circuits. These sensors may sample and measure the condition of the spent cleaning fluids to determine the cleanliness of the carrier components being washed. One such measure of cleanliness is the level of particulates in the fluid. The operator or a control system monitors the cleaning progress and controllably starts or stops the process when a predetermined level of cleanliness is reached. By including such sensors, the carrier components may be cleaned to a certain specification or may be tracked to profile the level of contamination of certain carriers. A variety of suitable sensors can be utilized for this function without undue experimentation.

The cleaning apparatus is also preferably provided with an air circulation system. There are two types of air introduced into the wash bays during a cleaning cycle, high pressure and low pressure. The high pressure air is used during the drying portion of the cleaning cycle to promote drying. The interior spray fitting 858 can provide a relatively high pressure bust of air to promote the drying of the interior of the container. The low pressure air introduced to the wash cycle is used to introduce ionization and to dehumidify the air in the wash bay 804.

Referring to FIG. 21, an air exhaust duct 837 and an air introduction duct 836 are shown. The circulation system takes relatively dry air from the environment or from another supplied source, warms that air and then introduces it into the wash bay 804 thought the introduction duct 836. The exhaust duct 837 in the rear of the bay 804 removes the air from the bay. The removed air is relatively more humid due to the presence of moisture from the cleaning fluid as part of the cleaning process. The circulation system also filters the incoming air to ensure that no particles are introduced to the bay 804 via the incoming air. The air circulation is also provided to the rotational housing 866 of the door cleaning assembly 864.

Ducts 836 and 837 are used to introduce and remove the low pressure ionized air for the wash bay 804 respectively. The ionized air is heated, filtered and ionized prior to introduction into the wash bay 804. Ionization is accomplished by the presence of an ionizer in the air duct. An additional ionizer 862 is provided in each of the wash bays where it communicates with the inside surface of the wafer container being washed. The ionizer 862 provides heated, filtered and ionized air into the interior of the container during the cleaning cycle.

The volume of air introduced to the interior of the container is such that the air pressure inside of the container is slightly greater than the pressure outside. The pressure positive differential provides a pneumatic barrier for minimizing the transmission of exterior cleaning fluids into the interior. The pressure differential can be monitored by a pressure sensor measuring the differential in inches of water.

The combination of the pneumatic barrier due to the positive pressure differential and the mechanical barrier provided by the configuration of the collar and other wash bay features functions to isolate the interior of the carrier from the exterior wash fluids, thereby maintaining two substantially separate fluidic circuits. Such isolation can be substantially accomplished without the need for any actual physical sealing along an interface. The lack of a physical interface is advantageous because it promotes drying efficiency. The inside surface of the door is similarly isolated from fluids used on the outside surface of the door.

Additionally, an ionizer 862 may be included in the inside region 845 for enhancing the cleaning of the inside surfaces of the carrier.

Figure 32:
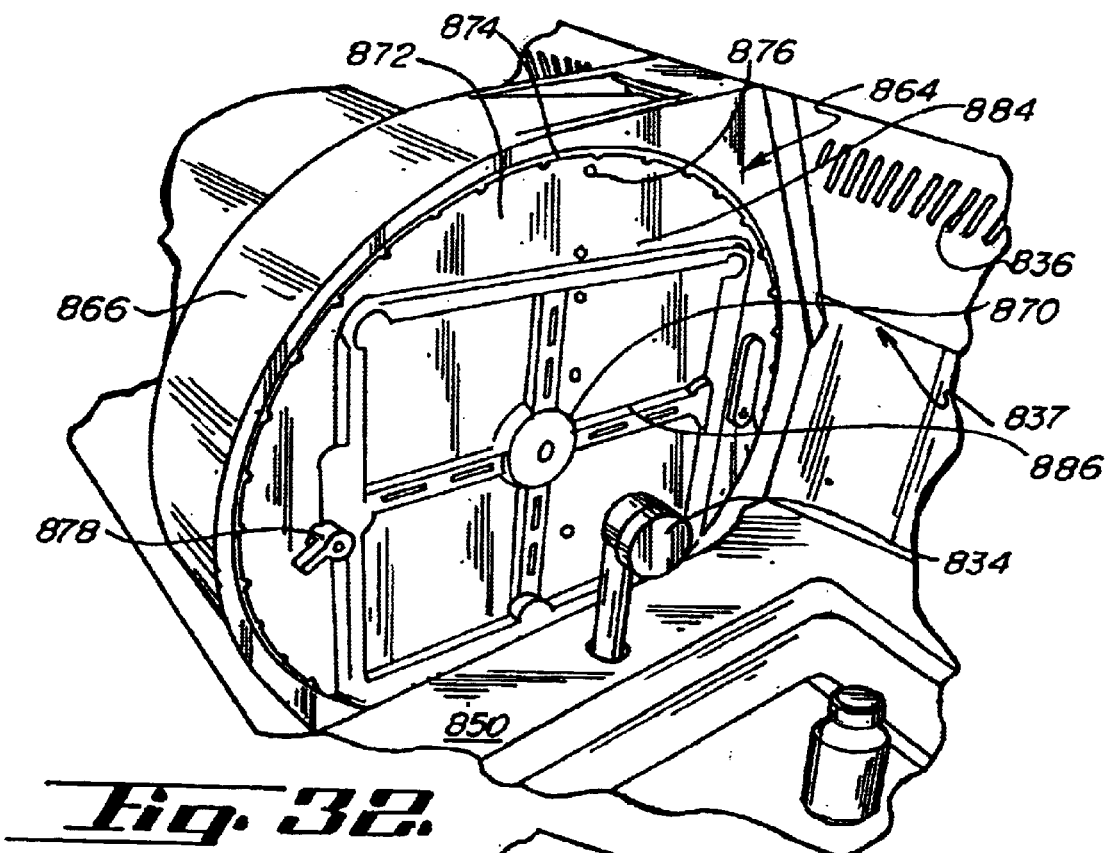
FIG. 32 is a detail view showing the container door rotational mount of the cleaning apparatus shown in FIG. 21.

Referring to FIG. 32, the door cleaning assembly 864 is shown with a portion of the carrier cleaning assembly 838. The door cleaning assembly 864 comprises a rotational housing 866 and a door receiving assembly 872. The door receiving assembly 872 is comprised of a hub 870 and a frame 884 fastened thereto. The rotational housing is provided with a shaft 868 configured to receive hub 870. A locking ring or sheave 882 is provided on the shaft 868, which is keyed to the hub 870, shown in FIG. 33. Such two-piece design minimizes any wobble of the door retaining assembly 872. The shaft may also be fitted with a seal. The door retaining assembly may optionally include supplementary door restraints 878 for retaining the door in frame 884.

Figure 33:
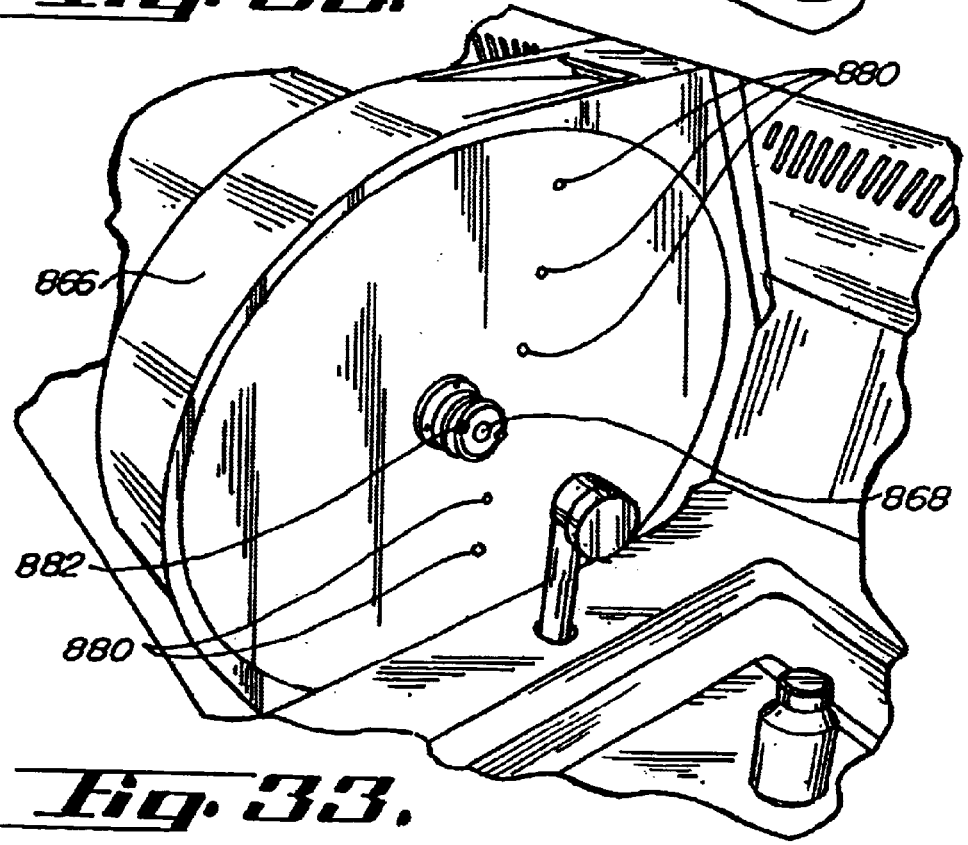
FIG. 33 is a detail view showing the container door rotational mount of the cleaning apparatus shown in FIG. 21 with the mounting wheel removed.

Referring to FIG. 33, the door cleaning assembly is shown with the door retaining assembly 872 removed. A plurality of nozzles 880 are disposed on the housing 866. The nozzles 880 are preferably angled, rather than straight forward to aid in the cleaning process. The nozzles 880 are also preferably along a straight line. Alternatively, the nozzles may be controllably aimed during the wash cycle to address particular cleaning needs.

Figure 34:
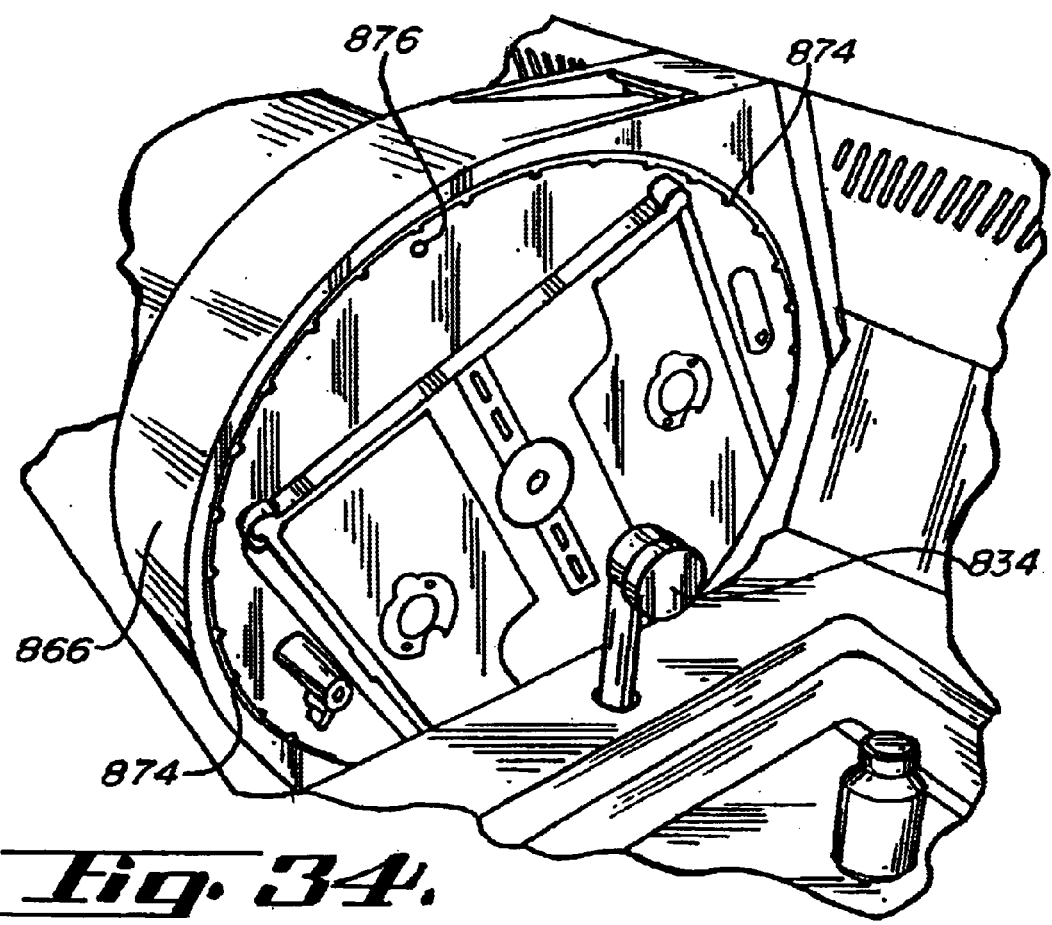
FIG. 34 is a detail view showing the container door rotational mount of the cleaning apparatus shown in FIG. 21 with a container door in place.

Referring to FIG. 34, the perimeter of frame 884 is preferably provided with a plurality of notches 874, or equivalent features, about its circumference. The housing 866 is provided with a plurality of air nozzles (not shown) configured to produce an air stream for rotating the door rotating assembly 872. The air stream bears against the notches 874, causing the assembly 872 to rotate. The air nozzles are configured to cause the assembly 872 to rotate in both a clockwise and counterclockwise direction. The ability to rotate in both directions provides for more effective cleaning. The door retaining assembly 872 is preferably rotated at about 300 rotations per minute during cleaning, although other speeds are within the scope of the invention. The assembly 872 may be rotated in both directions during a wash cycle.

Centrifugal force caused by the rotation of the carrier door not only enhances the efficiency of the cleaning process while the cleaning fluid is being sprayed at the door but also reduces the time for the cleaning fluid to be drained off of the door after the cleaning process is completed.

Referring to FIG. 34, the frame 884 is provided with a rotation sensor 876. The sensor is preferably a magnet embedded within the frame 884 itself. The magnetic field passing through a given point each rotation can be sensed by the cleaning apparatus 800. This allows the cleaning apparatus 800 to monitor the rotations per minute (RPM) and adjust the air nozzles accordingly to maintain a desired RPM.

All surface inside the wash bay are preferably formed of plastic and/or fluoropolymer. The only exception is that the hub 870 is constructed of aluminum and coated with a non-reactive material. Hub 870 is preferably constructed of aluminum because it is less likely to warp under service conditions, thereby having a longer service life and better operation.

In operation, the door is inserted into the frame 884 as shown in FIG. 34. The door is held in place by actuating the door latches. The latches engage a portion of the frame 884 having grooves configured to receive the latches. The door is then ready to undergo a wash cycle. During the wash cycle. The corresponding carrier or container is placed atop the supports 824. The lid 806 is closed and the cleaning cycle can be started. When completed, the door and carrier can be removed from their respective positions.

Another aspect of the present invention relates to the method in which the cleaning process is conducted. In particular, it has been recognized that continuously moving the spray nozzles provides less than optimal usage of cleaning fluid to obtain a desired level of contamination removal from the wafer carrier and the wafer carrier door.

Certain regions of the wafer carrier and the wafer carrier door present a greater obstacle to removing contaminants. One such region is where components of the wafer carrier are joined together.

It has been found that varying the rate at which the spray nozzles are moved over the wafer carrier such that areas where more cleaning is needed receive a longer dwell time than other areas that do not need the extra cleaning.

Movement of the spray nozzles is preferably stopped when the spray nozzles are directed to an area of the wafer carrier that is more difficult to clean. After a predetermined time, movement of the spray nozzles is reinitiated. Using such a cleaning procedure not only reduces the length of the cleaning process but also reduces the amount of cleaning fluid that is used during the cleaning process.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. An apparatus for cleaning a semi-conductor wafer carrier having an interior surface and an exterior surface, the apparatus comprising:
    a base portion having a first aperture and a second aperture, the base configured to support a wafer carrier about the first aperture, the base portion further comprising a third aperture, the base configured to support a wafer carrier door holding fixture in contact about the third aperture;
    a first fluidic circuit; and,
    a second fluidic circuit;
    wherein the first fluidic circuit is configured to circulates fluid between the first aperture and the interior surfaces of a wafer carrier and the second fluidic circuit is configured to circulates fluid between the second aperture and the exterior surfaces of a wafer carrier and wherein, the base portion configured to substantially isolate the first fluidic circuit from the second fluidic circuit, and wherein the first fluidic circuit circulates fluid between the first and third apertures and the interior surfaces of a wafer carrier and a wafer carrier door holding fixture and the second fluidic circuit circulates fluid between the second aperture and the exterior surfaces of a wafer carrier and a wafer carrier door holding fixture to remove contaminants from the interior and exterior surfaces of wafer carrier and a wafer carrier door.

2. The apparatus of claim 1, wherein the first fluidic circuit includes a first applicator for directing fluid onto the interior surfaces of a wafer carrier, and the second fluidic circuit includes a second applicator for directing fluid onto the exterior surface of a wafer carrier.

3. The apparatus of claim 2, wherein the first and second applicators are sprayers.

4. The apparatus of claim 3, wherein the first and second sprayers are maneuverably disposed in the base portion.

5. The apparatus of claim 4, the base further comprising sidewalls, and a rear wall connected to the base portion.

6. The apparatus f claim 5, further comprising a cover sealingly connectable to the base and movable to permit access therein.

7. An apparatus for cleaning a semi-conductor wafer carrier having an interior surface and an exterior surface, and a wafer carrier door having an inside surface and an outside surface, the apparatus comprising:
    a base including a fluid leakage detector and one more wash bays disposed in the base, each wash bay comprising a container cleaning assembly; and a door cleaning assembly, wherein a first cleaning fluid is used to clean the interior surface of the carrier and the inside surface of the door, and a second cleaning fluid is used to clean the exterior surface of the carrier and the outside surface of the door, the wash bays configured to substantially prevent communication of the second fluid with the first fluid.

8. The apparatus of claim 7, wherein the container cleaning assembly includes a container fluid sprayer configured to permit selectable variable movement.

9. The apparatus of claim 7, wherein the door cleaning assembly includes a door fluid sprayer configured to permit selectable variable movement.

10. An apparatus for cleaning a semi-conductor wafer carrier having an interior surface and an exterior surface, and a wafer carrier door having an inside surface and an outside surface, the apparatus comprising:

a base and one or more wash bays disposed in the base, each wash bay comprising a container cleaning assembly the container cleaning assembly including an ionizer for introducing ionized air into the interior surface of the wafer carrier; and a door cleaning assembly, wherein a first cleaning fluid is used to clean the interior surface of the carrier and the inside surface of the door, and a second cleaning fluid is used to clean the exterior surface of the carrier and the outside surface of the door, the wash bays configured to substantially prevent communication of the second fluid with the first fluid.

11. The apparatus of claim 7, wherein the container cleaning assembly includes a ridge configured to substantially isolate the first fluidic circuit from the second fluidic circuit.

12. The apparatus of claim 7, further comprising a closure releasably mounted to the base and configured to form a fluid tight seal at an interface between the closure and base.

13. The apparatus of claim 12, wherein the base includes a closure sensor for detecting a breach of the fluid tight seal during operation.

14. An apparatus or cleaning a semi-conductor wafer carrier having an interior surface and a exterior surface, the apparatus comprising: a base portion configured to receive a wafer carrier component, a first fluidic circuit adapted to communicate with the interior surface and a second fluidic circuit adapted to communicate with the exterior surface, and means for substantially isolating the first fluidic circuit from the second fluidic circuit, wherein the means for isolating includes a means for mechanically isolating the first fluidic circuit from the second fluidic circuit.

15. An apparatus for cleaning a semi-conductor wafer carrier having an interior surface and n exterior surface, the apparatus comprising: a base portion configured to receive a wafer carrier component, a first fluidic circuit adapted to communicate with the interior surface and a second fluidic circuit adapted to communicate with the exterior surface, and means for substantially isolating the first fluidic circuit from the second fluidic circuit, wherein the means for isolating includes a means for pneumatically isolating the first fluidic circuit from the second fluidic circuit.

* * * * *